[12] United States Patent
Shibazaki

(10) Patent No.: US 6,930,842 B2
(45) Date of Patent: Aug. 16, 2005

US006930842B2

(54) OPTICAL ELEMENT HOLDING DEVICE FOR EXPOSURE APPARATUS

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/823,767

(22) Filed: Mar. 30, 2001

(65) Prior Publication Data

US 2001/0038500 A1 Nov. 8, 2001

(30) Foreign Application Priority Data

Mar. 31, 2000 (JP) ........................................ 2000-099882
Mar. 15, 2001 (JP) ........................................ 2001-074702

(51) Int. Cl.[7] ................................................ G02B 7/00
(52) U.S. Cl. ........................ 359/822; 355/77; 438/800
(58) Field of Search ........................ 359/819, 820, 359/822, 823, 824, 826, 827, 821; 355/77; 438/29

(56) References Cited

U.S. PATENT DOCUMENTS

| 4,733,945 | A | * | 3/1988 | Bacich ........................ 359/820 |
| 5,070,489 | A | * | 12/1991 | Perry et al. ............... 369/44.16 |
| 5,383,168 | A | | 1/1995 | O'Brien et al. .......... 369/44.14 |
| 5,428,482 | A | | 6/1995 | Bruning et al. |
| 5,488,514 | A | | 1/1996 | Bruning et al. |
| 5,521,764 | A | * | 5/1996 | Balogh et al. ............... 359/824 |
| 5,638,223 | A | * | 6/1997 | Ikeda .......................... 359/827 |
| 5,822,133 | A | | 10/1998 | Mizuno et al. ............. 359/696 |
| 5,852,518 | A | | 12/1998 | Hatasawa et al. .......... 359/822 |
| 5,973,863 | A | | 10/1999 | Hatasawa et al. .......... 359/823 |
| 5,986,827 | A | * | 11/1999 | Hale .......................... 359/822 |
| 6,122,114 | A | * | 9/2000 | Sudo et al. ................. 359/819 |
| 6,144,510 | A | * | 11/2000 | Neil et al. .................. 359/820 |
| 6,191,898 | B1 | | 2/2001 | Trunz et al. ................ 359/819 |
| 6,229,657 | B1 | | 5/2001 | Holderer et al. ........... 359/822 |
| 6,239,924 | B1 | * | 5/2001 | Watson et al. ............. 359/819 |
| 6,259,571 | B1 | | 7/2001 | Holderer et al. ........... 359/819 |
| 6,271,976 | B1 | * | 8/2001 | Weber ........................ 359/819 |
| 6,275,344 | B1 | | 8/2001 | Holderer .................... 359/822 |
| 6,307,688 | B1 | * | 10/2001 | Merz et al. ................. 359/819 |
| 6,388,823 | B1 | | 5/2002 | Gaber et al. ............... 359/819 |
| 6,400,516 | B1 | * | 6/2002 | Spinali ....................... 359/819 |
| 6,445,514 | B1 | | 9/2002 | Ohnstein et al. |
| 6,445,516 | B2 | * | 9/2002 | Osterried ................... 359/819 |

FOREIGN PATENT DOCUMENTS

| EP | 0 742 492 A1 | 11/1996 | ............ G03F/7/20 |
| JP | 10-186196 | 7/1998 | ............ G02B/7/02 |
| WO | WO 99/67683 | 12/1999 | ............ G03F/7/00 |

OTHER PUBLICATIONS

Search Report dated Dec. 23, 2004 in related application EP 01 10 8020.

* cited by examiner

Primary Examiner—Scott J. Sugarman
Assistant Examiner—Darryl J. Collins
(74) Attorney, Agent, or Firm—Synnestvedt & Lechner LLP

(57) ABSTRACT

An optical element holding device includes a ring body for accommodating an optical element and a drive mechanism for driving the optical element. The ring body has an inner ring portion, which engages with a peripheral edge of the optical element, and an outer ring portion integral with the inner ring portion. The drive mechanism includes an actuator, a displacement increasing mechanism and a guide mechanism. The guide mechanism transfers displacement of the actuator to the inner ring and moves the inner ring axially.

42 Claims, 16 Drawing Sheets

OPTICAL ELEMENT HOLDING DEVICE FOR EXPOSURE APPARATUS

BACKGROUND OF THE INVENTION

The present invention relates to an exposure apparatus and more specifically relates to a device for holding an optical element in an exposure apparatus.

Manufacturing methods of microdevices such as semiconductor devices, liquid crystal display elements, image pickup devices or thin film magnetic heads, and manufacturing methods of masks such as reticles or photomasks include a photolithography process using an exposure system. In the photolithography process, substrates (wafers or glass plates) on which a photosensitive material or a photoresist is applied, are treated. More specifically, in the photolithography process, a pattern on a reticle is illuminated by an illumination optical system. Then the image of the pattern is transferred to each of shot regions defined in the substrate through a projection optical system.

Recently, the manufacture of highly integrated semiconductor devices requires the transfer of a fine pattern. Thus, the exposure apparatus requires a projection optical system which has extremely small wave front aberration and distortion.

To satisfy the requirements, a prior art exposure apparatus 100 shown in FIG. 23 includes a drive mechanism 95 that adjusts the position of an optical element 92. That is, the exposure apparatus 100 includes a barrel 91, a plurality of lenses 92 (92a, 92b) accommodated in the barrel 91 and an optical element holding device 93 that holds two lenses 92a placed near a reticle R. By the optical element holding device 93, the two lenses 92a are moved in the optical axial direction, which is shown by the broken line, and their optical axes are inclined with respect to the optical axial direction. Further, other lenses 92b, which are placed in the intermediate portion of the barrel 91 and in the vicinity of a wafer W, are fixed to the barrel body 91a.

FIG. 25 shows a holding mechanism of the lenses 92a. The lenses 92a are accommodated in a sub-barrel 91b. The sub-barrel 91b is connected to the top end of the barrel body 91a and is movable in the axial direction through three plate springs 94. One end of each plate spring 94 is bolted to the barrel body 91a (or a static sub-barrel 91c of FIG. 24) by a bolt 98, and the other end of the plate spring 94 is bolted to the sub-barrel 91b by a bolt 98. A plurality of actuators 95 (FIG. 23) including piezo-electric elements are arranged around the barrel body 91a. The actuators 95 cause the lenses 92a to move in the optical axial direction together with the sub-barrel 91b. On the outer surface of the barrel body 91a are arranged a plurality of sensors 96 in the vicinity of the actuators, respectively. The sensors 96 detect the position and attitude of the sub-barrel 91b.

The lens 92a is moved by the actuator 95 in the optical axial direction with the sub-barrel 91b. This enables the efficient manufacture of the projection optical system including the barrel 91. Further, in the exposure apparatus equipped with such a projection optical system, changes in various aberrations or distortions due to changes in the atmospheric pressure and illumination heat occur. However, it is possible to correct the changes in the aberrations and distortions easily in real time in the exposure process.

However, in the exposure apparatus 100, only the lens 92a that is placed in the vicinity of the reticle R is moved by the actuator 95. Therefore, the types of optical aberrations to be corrected are limited.

The group of lenses 92b, which is arranged in the intermediate portion of the projection optical system, has a larger influence on the image forming properties when moved in the optical axial direction or the tilt direction than the group of lenses 92a, which is arranged at the top portion of the projection optical system and in the vicinity of the reticle R. In other words, the movement of the lenses 92b in the optical axial direction or the tilt direction greatly affects the image formation property. Therefore, if the lens group 92b in the intermediate portion of the projection optical system is driven, a higher drive performance and guide precision than in the lens group 92a near the reticle R are required for its drive control. In the exposure apparatus 100 it is difficult to meet such requirements.

To move the lens 92b in the intermediate portion of the projection optical system, additional sub-barrel, which accommodates the lens 92a and 92b, is required. The sub-barrel 91b is movably supported on the additional sub-barrel. Thus, even if in the barrel 91, the sub-barrel 91b can be driven, it was difficult to move the additional sub-barrel with the sub-barrel 91b.

The inventor of the present invention proposed an exposure apparatus 200 shown in FIG. 24, which includes a projection optical system having three lenses 92a and three lenses 92b. By driving a plurality of stacked movable sub-barrels 91b, the lenses 92a accommodated in the movable sub-barrels 91b can be moved. However, in the exposure apparatus 200, a static sub-barrel 91c accommodating the lenses 92b cannot be stacked directly on the movable sub-barrel 91b. As a result, each static sub-barrel 91c is supported on the lower static sub-barrel 91c through a supporting member 97.

However, in the exposure apparatus 200 shown in FIG. 24, a supporting member 97 having a larger diameter than the barrel 91 increases the size of the barrel 91. Further, since the actuator 95 and sensors 96 corresponding to the movable sub-barrels 91b are arranged in the supporting member 97, the maintenance, exchange and inspection of the actuator 95 and sensors 96 are intricate.

Additionally, when the specific wave front aberration or distortion component is corrected, driving at minimum five portions is required in principle and five optical element holding devices 93 having movable sub-barrels 91b are needed. In this case, it becomes difficult to ensure the accommodation space for lenses 92b in the barrel body 91a.

Further, when the actuator 95 is a piezo-electric element with high precision, low heat generation, high stiffness and high cleanliness, the actuator 95 is relatively long and parallel to the optical axis. This may necessitate enlargement of the barrel body 91a. Accordingly, as the actuator 95, a voice coil motor, or a fluid pressure drive, which is compact and has a large movable range, may be used.

However, since the voice coil motor generates heat in operation, the lens 92a is not positioned precisely and various aberrations due to the heat are simultaneously generated. On the other hand, when the fluid pressure actuator is used, the stiffness for supporting the movable sub-barrel 91b may be insufficient. Thus, the vibration of the outer portions of the exposure apparatus may affect the movable sub-barrel 91b so that the control responsibility for the movable sub-barrel 91b is degraded. In particular, in a recent scan type exposure apparatus, a reticle stage and a wafer stage are driven at high speed. As a result, a relatively large load acceleration acts on the barrel. Thus, maintaining stiffness in supporting the movable sub-barrel 91b is indispensable.

As described above, in the exposure apparatuses 100 and 200 use three plate springs 94 as a guide mechanism for the optical element holding device 93. In a construction shown in FIG. 26, slippage between the respective ends of the plate spring 94 and the corresponding barrels 91a to 91c cannot be avoided. Thus, when the actuator 95 allows the lens 92a to move in the optical axial direction together with the sub-barrel 91b, the plate spring 94 is bent. In this case, it is actually impossible to restrict slippage on the contact surfaces between the respective ends of the plate spring 94 and the corresponding barrels 91a to 91c to a sub μm order with only the fastening force of the bolts 98.

The main factor of this slippage is a cosine error due to bending of the plate spring 94, as shown in FIG. 27. When the plate spring 94 of length L, one end of which is fixed, is bent by an angle of only α, the horizontal direction distance between both ends of the bent plate spring 94 is shorter than the plate spring 94 before it is bent (when it is straight), by only the cosine error $L(1-\cos\alpha)$. Thus, a sub μm order slippage which compensates for the cosine error $L(1-\cos\alpha)$, occurs between the plate spring 94 and the barrels 91a to 91c.

When the lens 92a and the sub-barrel 91b are moved in the optical axial direction, they are also displaced by the mounting conditions, materials and variation in size of the three plate springs 94, in the radial direction as shown in FIG. 28.

If the amount of displacement in the radial direction is extremely slight, its influence on the image formation performance is small. However, when the amount of displacement in the radial direction exceeds a predetermined value, an image shift is generated on the wafer W so that registration precision is degraded. In this case, after measuring the amount of displacement of the lens 92a and the sub-barrel 91b previously, the displacement is corrected with a wafer stage so that the registration precision can be ensured. However, in order to make this correction possible, the correspondence between one part displacement with respect to the optical axial direction to one part displacement with respect to the radial direction, that is, the facts that reproducibility can be obtained in the displacement with respect to the radial direction to the displacement with respect to the optical axial direction and there is no hysteresis is a condition. This reason is that the correction of the image shift with the wafer stage is not a closed loop control which measures the positions of the image in real time, but an open loop control which monitors the displacement with respect to the optical axial direction.

However, since slippage occurs between the plate spring 94 and the barrels 91a to 91c, there is hysteresis in the displacements of the lens 92a and sub-barrel 91b, as shown in FIG. 28. Thus, it is difficult to correct the image shift with the wafer stage and to ensure the registration precision.

Further, from an optical viewpoint the tolerable degree of displacement is generally relatively large near the reticle R, but small in the intermediate portion of the projection optical system. Therefore, driving the lens group in the intermediate portion of the projection optical system requires a significantly higher precision than in driving the lens group near the reticle R. As a result, it is difficult to correct aberrations with high precision with the exposure apparatus shown in FIG. 24.

SUMMARY OF THE INVENTION

A first object of the present invention is to provide an optical element holding device which drives an optical element with high precision. A second object of the present invention is to provide a compact barrel. A third object of the present invention is to provide an exposure apparatus that projection-exposes a pattern image correctly on a substrate.

To achieve the above objects, the first aspect of the present invention provides a holding device for a first optical element, including a first holding portion communicated with an outer edge of the first optical element to hold the first optical element, a connecting portion connected to the first holding portion, and a drive mechanism provided in the connecting portion to move the first optical element by relatively moving the first holding portion and the connecting portion.

The second aspect of the present invention provides a barrel structure accommodating a plurality of optical elements, including an optical element holding device which holds at least one of the optical elements. The optical element holding device includes a holding portion communicated with an outer edge of one of the optical elements to hold the optical element, a connecting portion connected to the holding portion, and a drive mechanism provided in the connecting portion to move the optical element by relatively moving the holding portion and the connecting portion.

The third aspect of the present invention provides an exposure apparatus for transferring a pattern image formed on a mask onto a substrate using exposure light beam. The exposure apparatus includes a projecting optical system having at least one barrel module. The barrel module includes a optical element located on the path of the exposure light beam, a optical element holding portion communicated with an outer edge of the optical element to hold the optical element, a connecting portion connected to the holding portion, and a drive mechanism provided in the connecting portion for moving the optical element by relatively moving the holding portion and the connecting portion.

The fourth aspect of the present invention provides a method for making a semiconductor device using an exposure apparatus that transfers a circuit pattern image formed on a mask through a projection optical system onto a substrate using exposure light beam. The method includes applying a photo sensitive agent on a workpiece, exposing the circuit pattern image to the workpiece using the exposure apparatus. The exposure apparatus includes at least one barrel modules. Each of the barrel modules includes a optical element located on the path of the exposure light beam, a optical element holding portion communicated with an outer edge of the optical element to hold the optical element, a connecting portion connected to the holding portion, and a drive mechanism provided in the connecting portion to move the optical element by relatively moving the holding portion with respect to the connecting portion. The exposing step includes adjusting a image formation property of the projection optical system by moving the optical element. The method further includes developing the exposed workpiece, etching a exposed region except for the resist, and removing the resist from the workpiece. The photo sensitive agent forms a resist corresponding to the circuit pattern on the workpiece by the developing.

The fifth aspect of the present invention provides an optical element holding device, which includes a ring body accommodating an optical element, including an inner ring portion communicated with a peripheral edge of the optical element to hold the optical element, and an outer ring portion uniformly formed with the inner ring portion. The optical element holding device includes a drive mechanism provided in the ring body to move the inner ring portion by relatively moving the inner ring portion and the outer ring portion, a displacement increasing mechanism formed in the outer ring portion, and a guide mechanism formed in the outer ring portion and connected to the displacement increasing mechanism and the inner ring portion. The drive mechanism includes an actuator, which displaces in a predetermined direction, provided on the ring body. The guide mechanism transfers displacement of the actuator to the inner ring and converts the displacement of the actuator in a direction substantially along the optical axis of the optical element.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
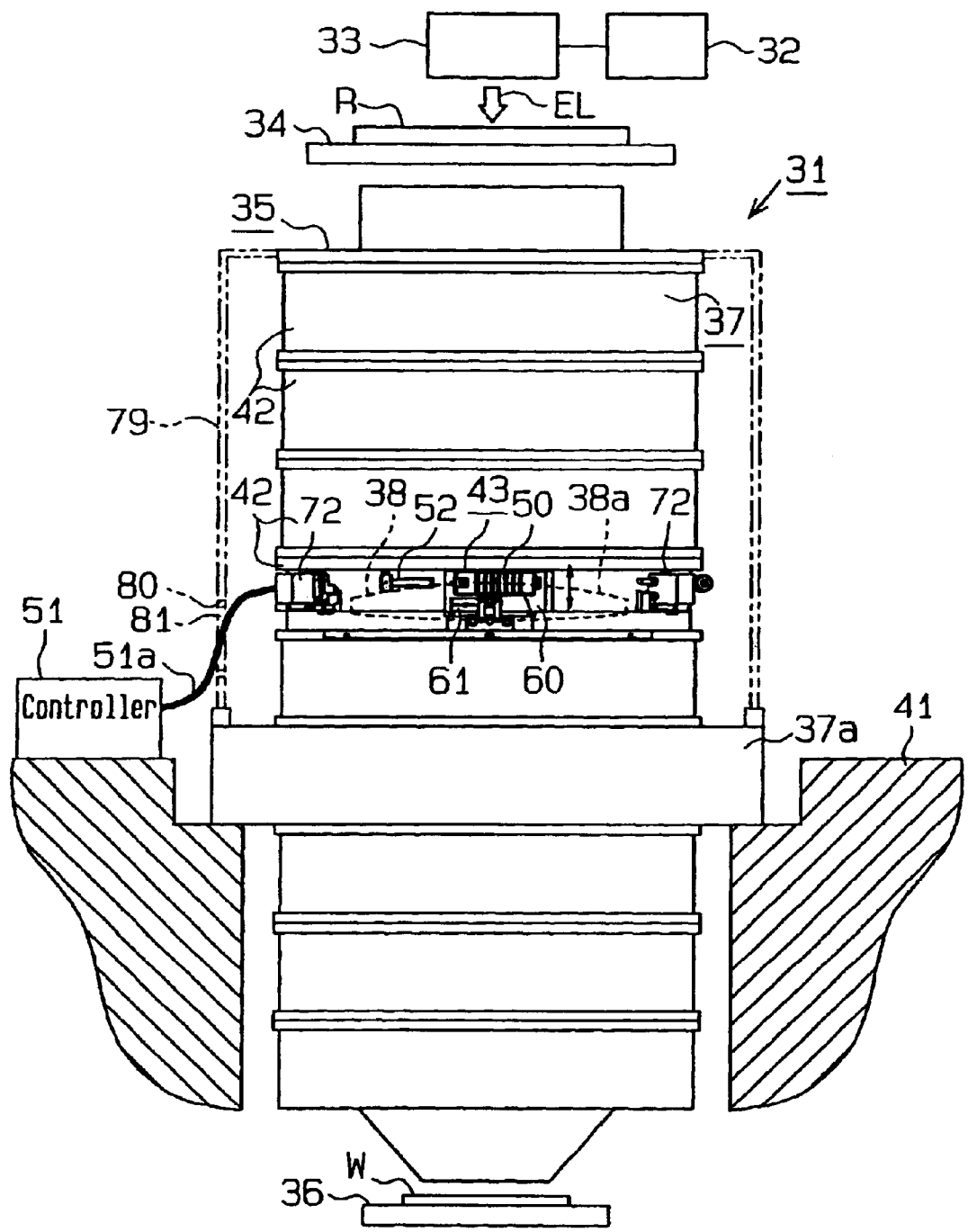
FIG. 1 is a schematic structural view showing an exposure apparatus according to a first embodiment of the present invention.

In the drawings, like numerals are used for like elements throughout.

First Embodiment

An exposure apparatus 31 according to a first embodiment of the present invention will be explained below with reference to FIGS. 1 to 14.

FIG. 1 is a schematic view of the exposure apparatus 31. The exposure apparatus 31 includes a light source 32, an illuminating optical system 33, a reticle stage 34, which holds a mask or a reticle R, a projection optical system 35, and a wafer stage 36, which holds a substrate or a wafer W.

The light source 32 is, for example, a high pressure mercury lamp, a KrF excimer laser light source, an ArF excimer laser light source, an $F_2$ laser light source, a metallic vapor laser light beam or a light source that oscillates higher harmonics such as YAG laser. The illuminating optical system 33 includes various lens systems such as a relay lens, a fly eye lens, a condenser lens, an aperture restriction and a blind arranged at a conjugate position with the pattern surface of the reticle R (not shown). The illuminating optical system 33 adjusts the exposure light beam EL, which is projected from the light source 32, into a light that uniformly illuminates the pattern on the reticle R.

The reticle stage 34 is positioned at the projecting side of the illuminating optical system 33 (the incidence side of the exposure light beam EL in the projection optical system 35) such that the reticle mounting surface is perpendicular to the optical axial direction of the projection optical system 35. The projection optical system 35 includes a barrel 37 accommodating a plurality of optical elements or lenses 38. The wafer stage 36 is positioned projection side of the exposure light beam EL in the projection optical system 35. The wafer mounting surface of the wafer stage 36 is positioned so as to cross the optical axis of the projection optical system 35. When the exposure light beam EL passes through the projection optical system 35, a pattern image on the reticle R is reduced by a predetermined reduction magnitude. Then, the reduced pattern image is transferred onto the wafer W on the wafer stage 36.

Next, a barrel 37 will be explained in detail.

The barrel 37 is positioned on a frame 41 of the exposure apparatus. The barrel 37 includes a plurality of barrel modules 42, or partial group barrels, stacked in the optical axial direction. One of the barrel modules 42 that is positioned at the intermediate portion of the projection optical system 35 and a predetermined number of the barrel modules 42 that are positioned above the intermediate barrel module 42 accommodate an optical element holding device 43 and a lens 38a. The lens 38a is held by the optical element holding device 43 and is movable in the optical axial direction and is tiltable with respect to the optical axial by the optical element holding device 43. Hereinafter, a lens that is moved in the optical axial direction and is tilted is referred as a movable lens.

Figure 2:
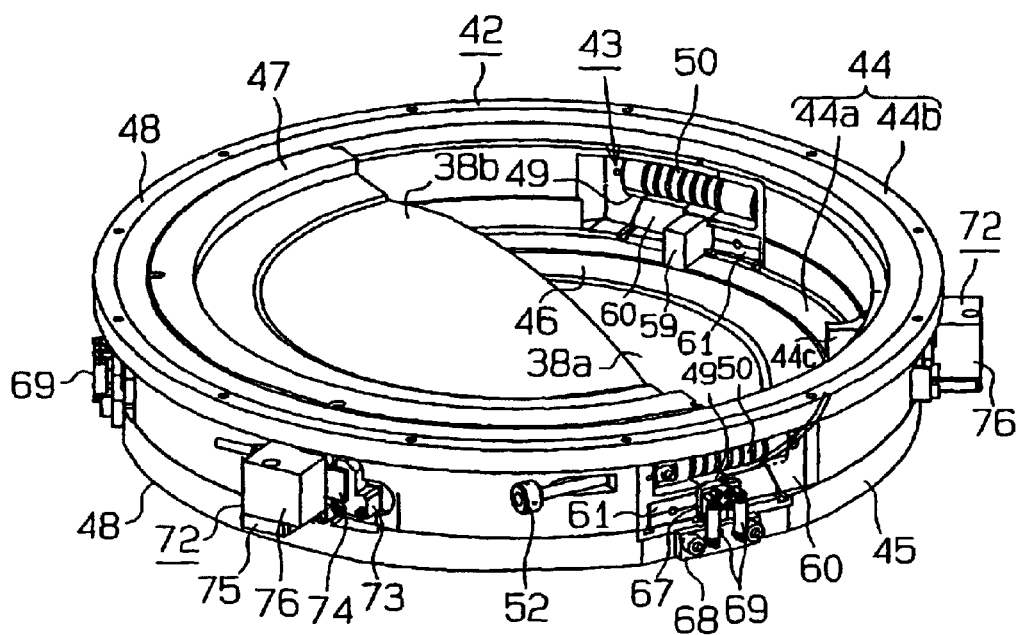
FIG. 2 is a partially cut-away perspective view of the barrel module in the projection optical system in FIG. 1.
Figure 3:
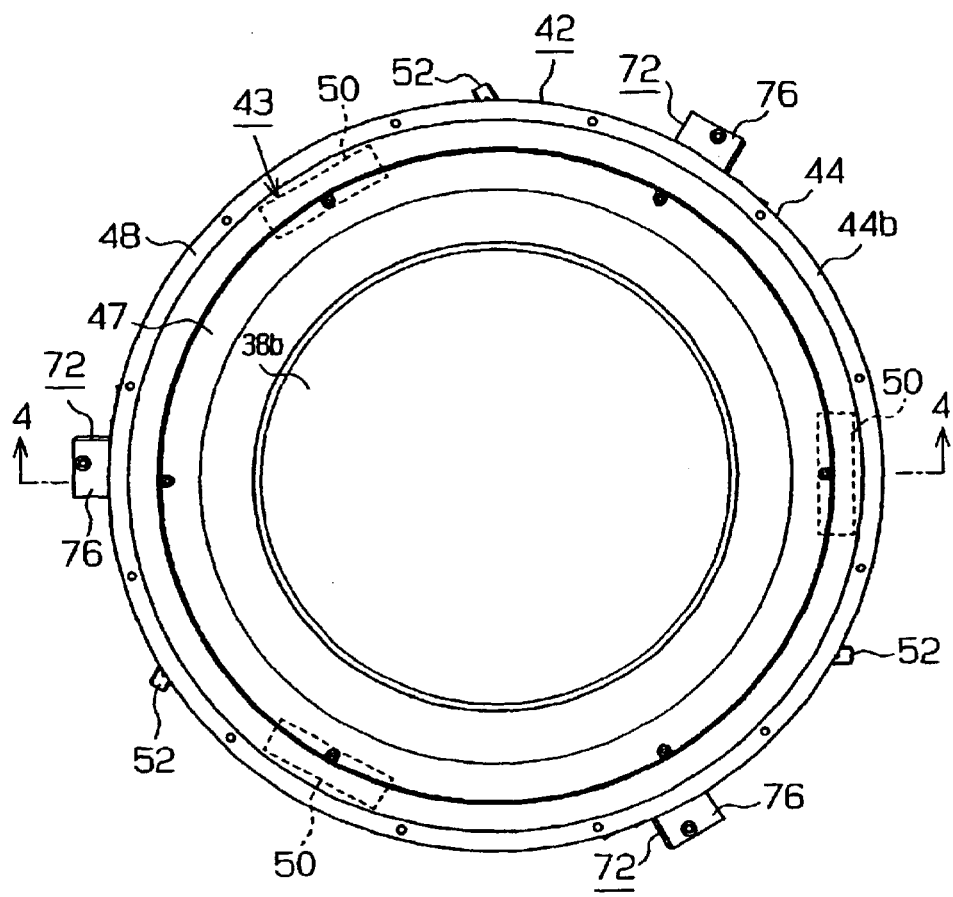
FIG. 3 is a plan view of the barrel module in FIG. 2.
Figure 4:
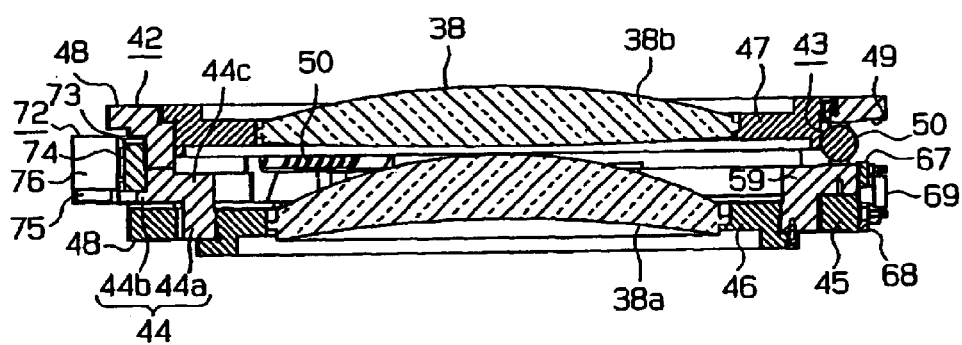
FIG. 4 is a cross-sectional view taken along the line 4—4 in FIG. 3.

FIG. 2 is a perspective view, with parts cut away, of one of the barrel modules 42. FIG. 3 is a plan view of the barrel module 42 of FIG. 2. Further, FIG. 4 is a cross-sectional view of the barrel module 42 of FIG. 2. As shown in FIGS. 2 to 4, the barrel module 42 has a barrel body 44. The barrel body 44 includes an inner ring portion 44a, which acts as a first holding portion, and an outer ring portion 44b, which acts as a connecting portion to which the inner ring portion 44a is connected. The outer ring portion 44b has a mounting surface 48 for coupling another barrel module 42 along the optical axial direction and acts as a connecting portion for another barrel module 42. In other words, the outer ring portion 44b has the function of connecting the barrel module 42 to another device, such as another barrel module 42 or the body of the exposure apparatus 31. The inner ring portion 44a and the outer ring portion 44b are integrally formed. The outer ring portion 44b is cylindrical. A base ring 45 is fixed to the lower end of the outer ring portion 44b. The inner ring portion 44a is cylindrical and has an outer diameter that is slightly smaller than the inner diameter of the outer ring portion 44b. The inner ring portion 44a is movable in the optical axial direction inside the base ring 45.

Inside the inner ring 44a is mounted a first lens support 46, which holds the movable lens 38a. Specifically, the movable lens 38a includes a flange having a pair of parallel flat surfaces. The lower surface of the flange is placed on a plurality of receiving seats (not shown) protruding inside the first lens support 46. To the upper surface of the flange, a lens securing member for securing the flange to the receiving seats is attached. Inside the outer ring portion 44b is mounted a second lens support 47, which holds the static lens 38b. Specifically, the second lens support 47 holds the lens 38b such that the optical axis of the lens 38b coincides with the optical axis of the movable lens 38a or the optical properties of both lenses 38a and 38b are optimized. The lens 38b is fixed to the barrel body 44. Hereinafter, the lens 38 is referred as a static lens. A lens chamber is defined between the lens 38a held by the first second lens support 46 and the lens 38b held by the second lens support 47.

The barrel modules 42 are stacked to form the barrel 37. Each of a lower barrel module 42 that facing the wafer stage 36 and a upper barrel module 42 that facing the reticle stage 34 has a mounting surface 48 at one end surface of the outer ring portion 44b. Each of the intermediate barrel modules 42 located between the upper and the lower barrel modules 42 has two mounting surfaces 48 at two end surfaces of its outer ring portion 44b. A flat mounting surface 48 is formed on the top end of the outer ring portion 44b and the bottom end of the base ring 45 respectively. When the barrel modules 42 are stacked, the mounting surface 48 of the outer ring portion 44b is faced to the mounting surface 48 of the base ring 45 of an upper barrel module 42. Therefore, the barrel modules 42 are stacked in a stable manner in the optical axial direction. The loads of the barrel modules 42 do not act on the inner ring portion 44a. A gap adjusting member (not shown) for adjusting the distance between adjacent barrel modules 42 is located between the adjacent mounting surfaces 48. The gap adjusting member includes a ring washer having a diameter substantially equal to that of the outer ring portion 44b and a plurality of additional ring washers, each having smaller diameter than the radial width of the mounting surface 48. The latter ring washers are located on the mounting surface 48 at equal angular intervals. In the first embodiment, when the barrel modules 42 are stacked, each mounting surface 48 does not contact the corresponding mounting surface 48 of the adjacent barrel module 42.

Figure 5:
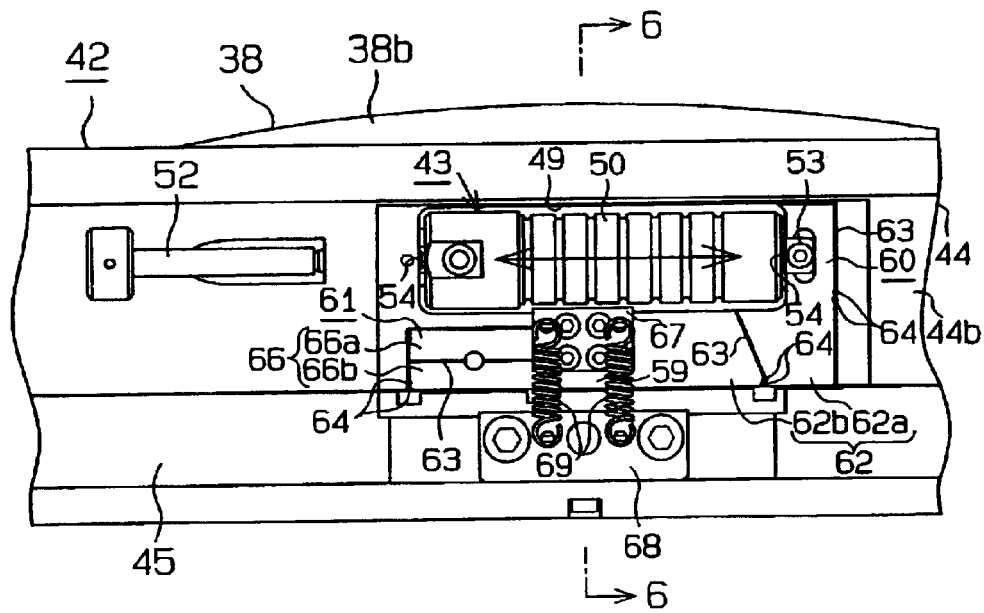
FIG. 5 is an enlarged side view of the barrel module in FIG. 2.
Figure 6:
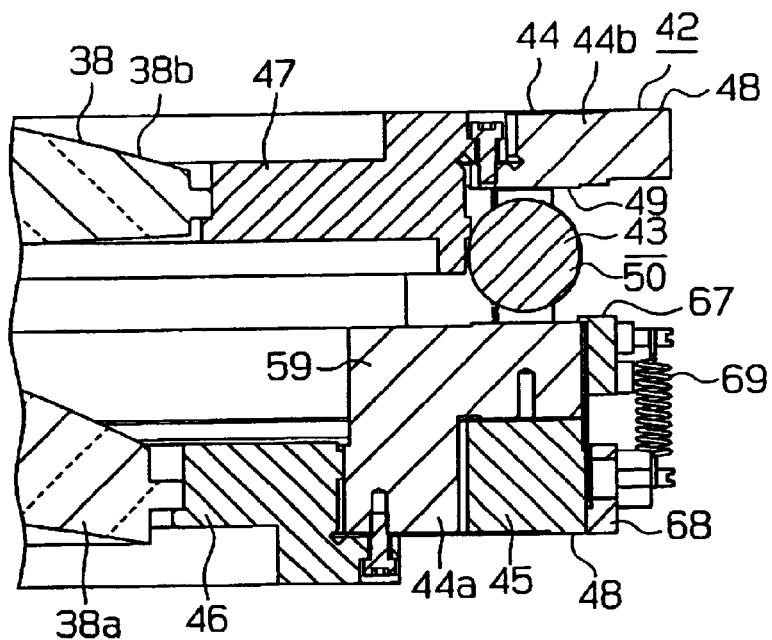
FIG. 6 is a partial cross-sectional view taken along the line 6—6 in FIG. 5.

FIG. 5 is an enlarged view of one of the drive mechanisms of the barrel module, and FIG. 6 is a cross-sectional view of the mechanism of FIG. 5. Three cutaway portions 49 (see FIG. 2) are formed the peripheral wall (or the outer wall) at equal angular intervals. As shown in FIG. 3, three actuators 50 are accommodated in the three cutaway portions 49. A longitudinal axis of each actuator 50 extends along the tangential direction of the outer ring portion 44b. The actuators 50 are exposed on the peripheral wall of the outer ring portion 44b. Preferably, each actuator 50 is a piezoelectric element having properties of high precision, low heat generation, high stiffness and high cleanliness. A control device 51 applies a control voltage according to the control signal to the actuators 50 and controls the displacement (expansion and contraction) of the actuators 50. The displacement direction of each actuator 50 is substantially tangential to the outer ring portion 44b.

Figure 13:
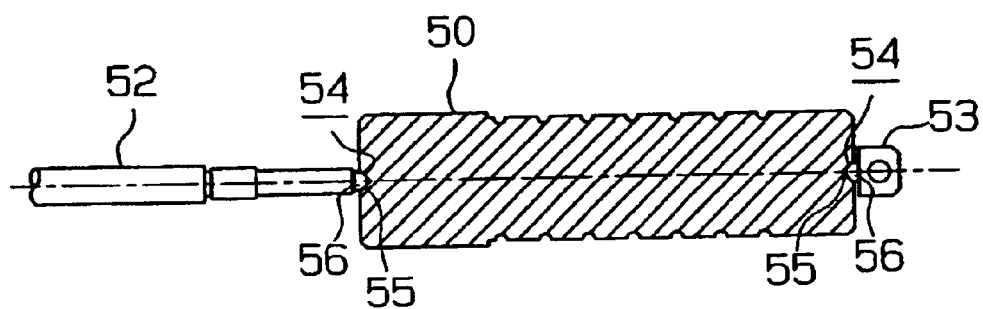
FIG. 13 is a cross-sectional view showing a connection structure of both ends of an actuator.

FIG. 13 is a schematic diagram showing the connection between the actuator 50 and the outer ring portion 44b. A holding bolt 52 is threaded into a first end portion of each actuator 50 at the peripheral wall of the outer ring portion 44b. The holding bolt 52 is coaxial with the actuator 50. A connecting jig 53 is attached to a second end portion of each actuator 50. The connecting jig 53 is fixed to a first link 62a of a displacement increasing mechanism 60, or a first link mechanism, formed on the outer ring portion 44b. A rotating pivot mechanism 54 including a conical groove 55 and a ball 56 is located between the first end portion of the actuator 50 and the end of the holding bolt 52, and between the second end portion of the actuator 50 and the connecting jig 53. The rotating pivot mechanism 54 allows the actuator 50, the holding bolt 52 and the connecting jig 53 to rotate relative to one other.

Figure 9:
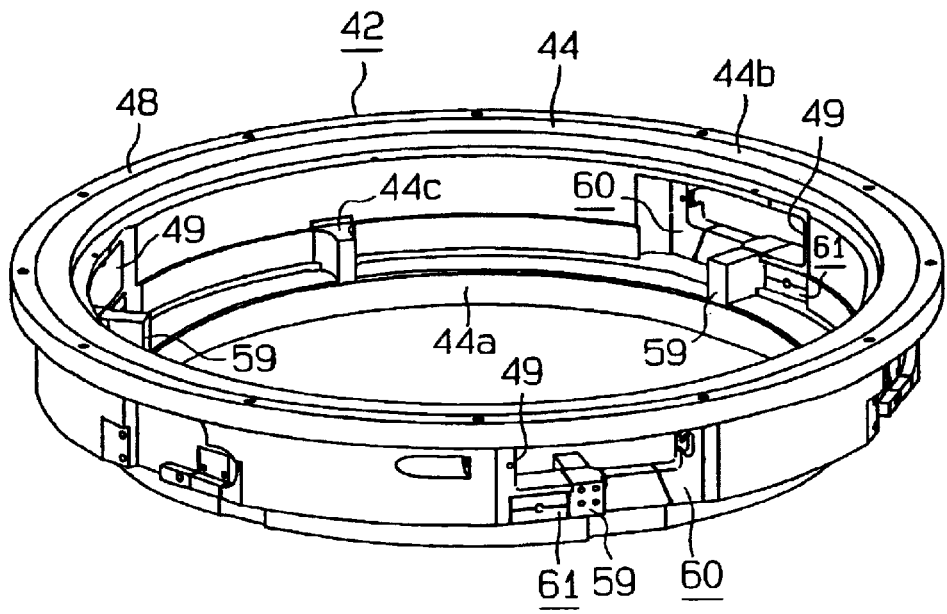
FIG. 9 is a perspective view showing the barrel body of the barrel module in FIG. 2.
Figure 10:
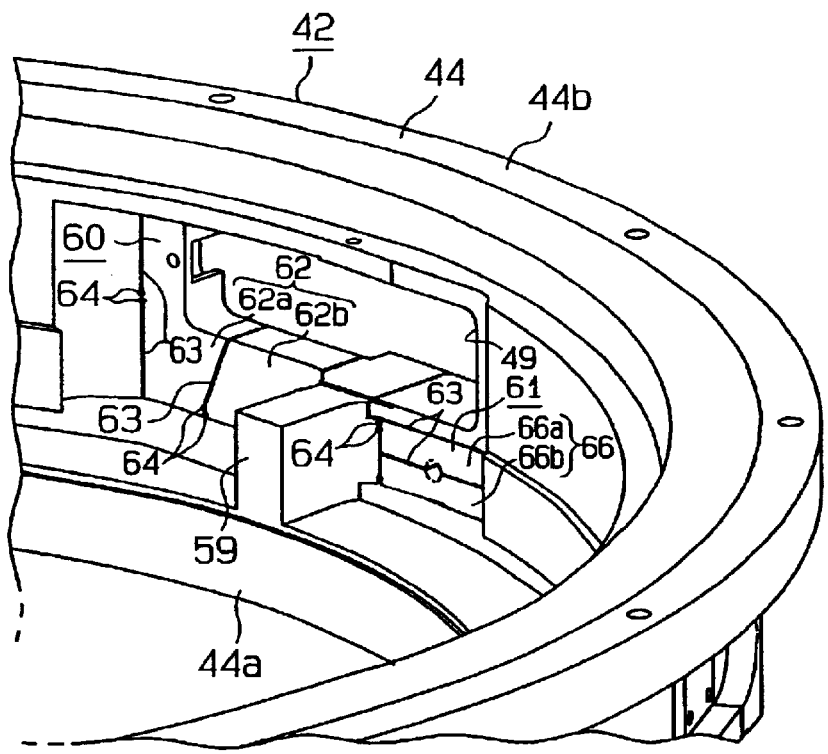
FIG. 10 is an enlarged perspective view of the barrel body in FIG. 9.
Figure 11:
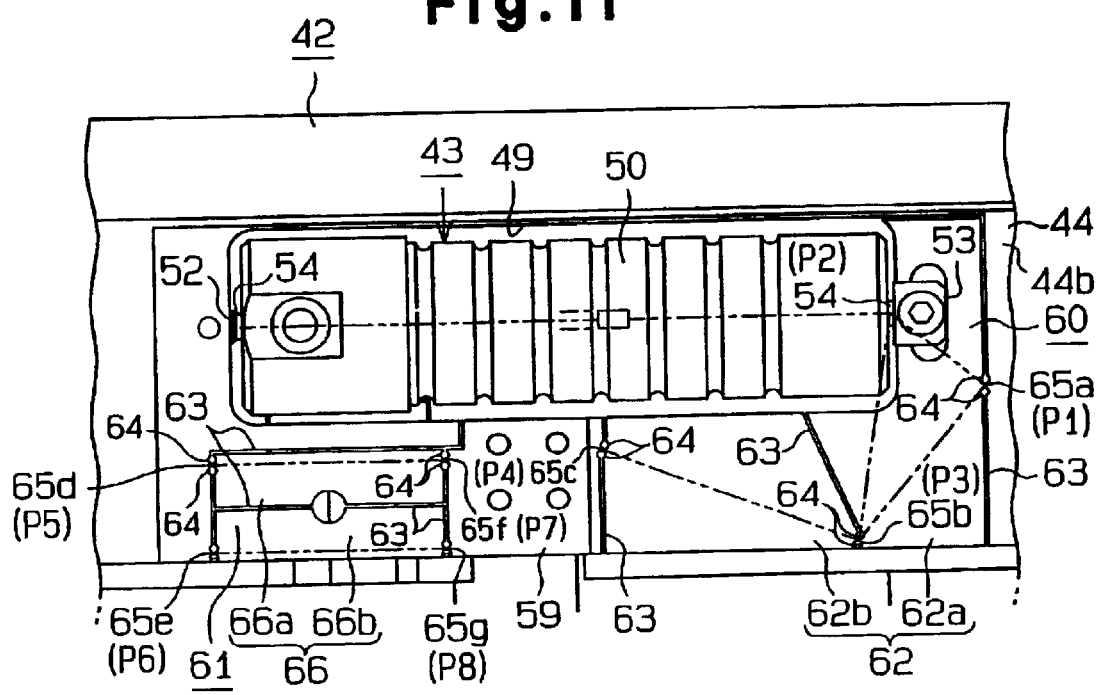
FIG. 11 is an enlarged side view of the barrel module in FIG. 5.

FIG. 9 is a perspective view showing the barrel body 44 of the barrel module 42, and FIG. 10 is an enlarged perspective view of a cutaway portion 49 of the barrel body 44. Further, FIG. 11 is a partial enlarged view of the actuator 50. As shown in FIG. 10, three connecting arm portions 59 are formed at positions corresponding to the actuators 50 on the upper end surface of the inner ring portion 44a. The outer ring portion 44b is provided with a displacement increasing mechanism 60 and a guide mechanism 61, or a second link mechanism, connected to the sides of the connecting arm portions 59, respectively. The inner ring portion 44a is connected to the outer ring portion 44b via the three actuators 50, the displacement increasing mechanism 60, the guide mechanism 61 and the connecting arm portions 59. The inner ring portion 44a is tilted with respect to the outer ring portion 44b when the actuators 50 are displaced by different amounts. The inner ring portion 44a is moved substantially axially with respect to the outer ring portion 44b when the actuators 50 are displaced by same amount. The lens 38a is tilted or is moved axially with the inner ring portion 44a by the actuators 50.

Each displacement increasing mechanism 60 increases the displacement of the associated actuator 50 and converts the displacement direction of the actuator 50 to the optical axial direction of the movable lens 38a. Each displacement increasing mechanism 60 includes an elastic hinge link mechanism 62 including a plurality of slits 63 and a plurality of through holes 64.

Figure 14:
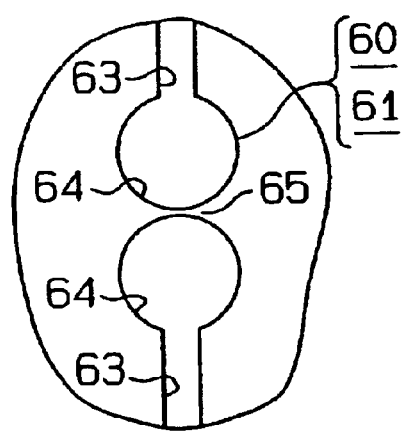
FIG. 14 is an enlarged partial side view showing an elastic hinge structure of the displacement increasing mechanism and the guide mechanism.

The elastic hinge link mechanism 62 will be explained as follows. FIG. 14 is an enlarged view of an elastic hinge portion 65. As shown in FIG. 11, the through holes 64 extend perpendicular to the optical axis of the optical element and the slits 63 connected to the through holes 64 are formed in the outer ring portion 44b on the right side of the respective connecting arm portions 59 by a wire cutting process. Specifically, the through holes 64 are formed such that they extend toward the axial center of the outer ring portion 44b. Further, the slits 63 are formed along the through holes 64 from the outer face of the outer ring portion 44b toward the inner surface. The elastic hinge portion 65 is formed between adjacent one pair through holes 64 (FIG. 14). The slits 63 and the through holes 64 define the first and second links 62a and 62b of the elastic hinge link mechanism 62.

Figure 12:
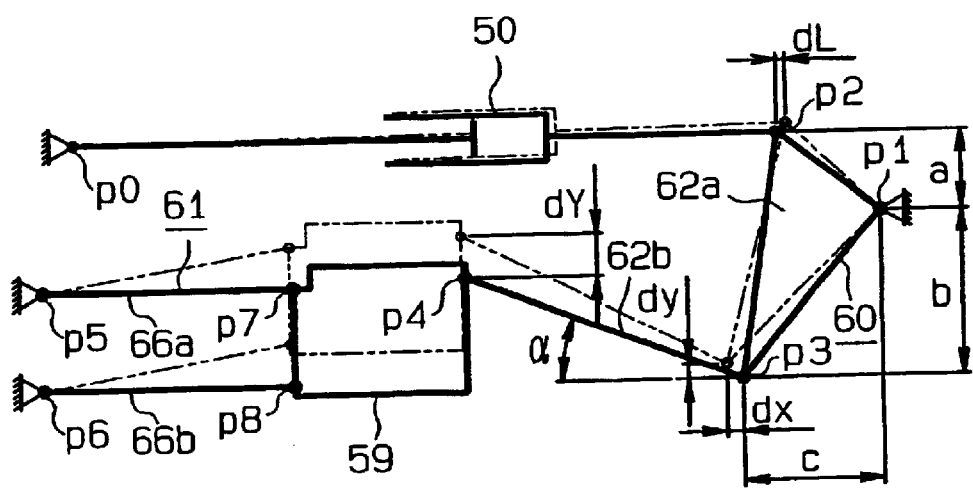
FIG. 12 is a schematic diagram of FIG. 11.

FIG. 12 schematically shows operation of each actuator 50, each displacement increasing mechanism 60 and each guide mechanism 61 in the barrel module 42. The first link 62a is connected to the second end portion of the actuator 50 through the rotating pivot mechanism 54 (connection point P2). Further, the first link 62a is pivotable about the elastic hinge portion 65a (fulcrum P1), which is near the second end portion of the actuator 50. The right end of the second link 62b is connected to the lower end of the first link 62a through the lower elastic hinge portion 65b (connection point P3) and the left end of the second link 62b is connected to the right side edge of the connecting arm portion 59 in the elastic hinge portion 65c (connection P4). The rotating pivot mechanism 54 of the first end portion of the actuator 50 corresponds to a fulcrum P0.

When the actuator 50 is extended while being rotated around the longitudinal axis, the first link 62a is pivoted clockwise about the fulcrum P1 as shown in FIG. 12, and the second link 62b is moved upward. Thus, the connecting arm portion 59 is displaced upward. In other words, the operation of the first and second links 62a and 62b amplifies the displacement of the actuator 50, and the displacement direction is changed by ninety degrees. As a result, the movable lens 38a held by the inner ring portion 44a is moved in the optical axial direction.

Each guide mechanism 61 is formed at left side of the connecting arm 59 in FIG. 11. Each guide mechanism 61 guides relative movement of the inner ring portion 44a with respect to the outer ring portion 44b in a predetermined direction (for example, substantially parallel to the optical axial direction of the movable lens 38a). Each guide mechanism 61 guides the connecting arm 59 such that the movable lens 38a is substantially coincident with the optical pivotal position. The optical pivotal position is a position on the optical axis where the image shift, which is generated when the movable lens 38a is tilted, becomes zero. Further, each guide mechanism 61 includes a parallel link mechanism 66 including a plurality of slits 63 and a plurality of through holes 64. The parallel link mechanism 66 is similar to the elastic hinge link mechanism 62. The through holes 64 are formed such that they extend perpendicular to the optical axis of the optical system (for example, the axis of the movable lens 38a), that is, toward the axis of the outer ring portion 44b. Further, the slits 63 continue to the through holes 64. Therefore, the slits 63 are formed along the through holes 64 from the outer surface of the outer ring portion 44b to its inner surface. Each of the slits 63 and the through holes 64 extends through the wall of outer ring 44b on a imaginary plane that includes the central axis of the outer ring 44b (or the optical axis of the optical element supported by the barrel module 42).

The elastic hinge portion 65 is formed between an adjacent pair of the through holes 64. The slits 63 and the through holes 64 define a pair of levers 66a and 66b of the parallel link mechanism. The levers 66a and 66b extend in the peripheral surface of the outer ring portion 44b.

As shown in FIGS. 11 and 12, the pair of levers 66a and 66b are pivotally connected to each other about the elastic hinge portions 65d and 65e (fulcrums P5 and P6) formed on the left ends of the levers 66a and 66b, respectively. The right end of the levers 66a and 66b are connected to the left side of the connecting arm portion 59. When the inner ring portion 44a is moved in the optical axial direction through the displacement increasing mechanism 60 and the connecting arm portion 59 due to displacement of the actuator 50, the levers 66a and 66b pivot counterclockwise about the fulcrums P5 and P6, respectively, as shown in FIG. 12. As a result, the movable lens 38a is not moved radially or tangentially, and the movement of the inner ring portion 44a is allowed only in the optical axial direction.

As shown in FIGS. 5 and 6, spring receivers 67 are attached to the outer surface of each connecting arm portion 59. The spring receivers 68 are attached to the outer periphery of the base ring 45 at the spring receivers 67. A pair of tension springs 69, which act as return mechanism, are hooked between the spring receivers 67 and 68. The inner ring portion 44a, which supports the movable lens 38a, is returned to the original position within the movable range by the force of the tension springs 69 in a non-operation state of the actuator 50.

Figure 7:
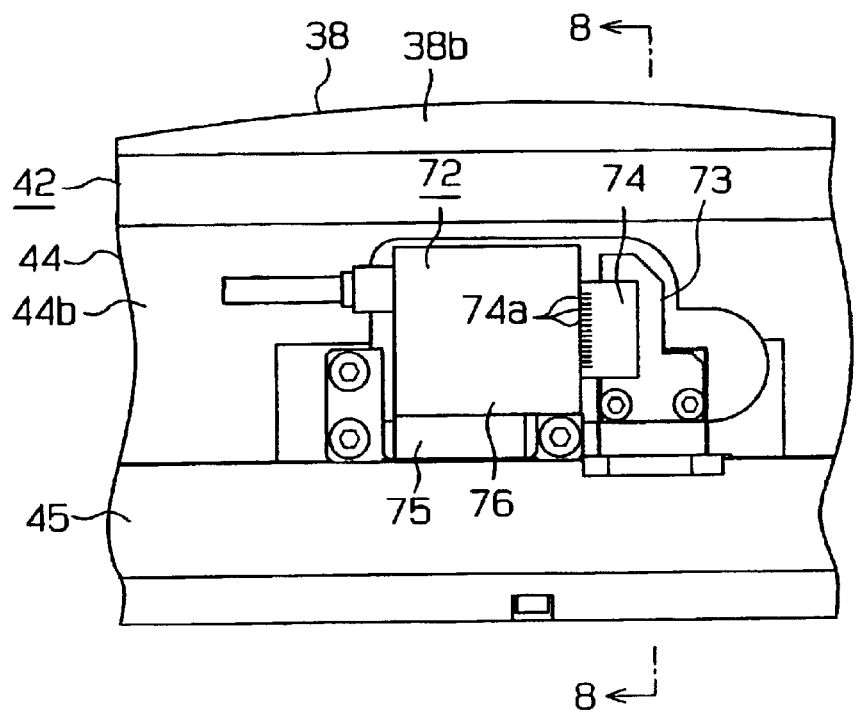
FIG. 7 is an enlarged side view of another part of the barrel module in FIG. 2.
Figure 8:
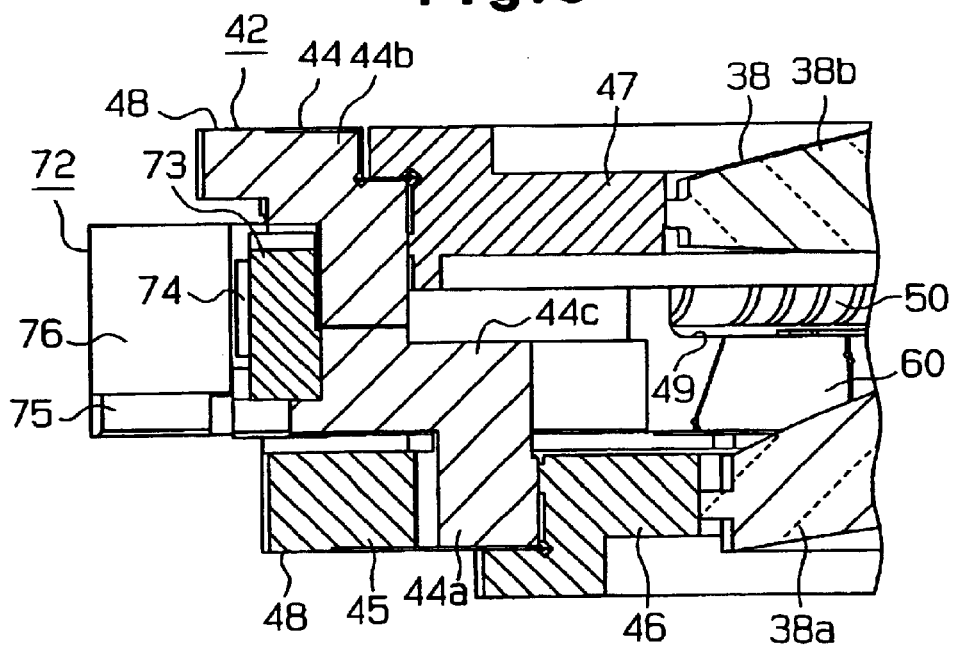
FIG. 8 is a partial cross-sectional view taken along the line 8—8 in FIG. 7.

FIG. 7 shows a sensor 72, or a measuring instrument, in the barrel module 42. FIG. 8 is a cross-sectional view taken along the line 8—8 in FIG. 7. As shown in FIGS. 2–4, 7 and 8, three openings, which accommodate three sensors 72, respectively, are arranged at equal angular intervals between the adjacent actuators 50 on the peripheral wall of the outer ring portion 44b. Each sensor 72 is preferably a non-contact encoder, for example, an optical encoder. Each sensor 72 has a scale 74 and a detecting head 76. The scale 74 is fixed to a scale holder 73 mounted on a scale base 44c on the inner ring portion 44a. The detecting head 76, which is accommodated in the opening, is used to read the scale. The scale is fixed to the inner ring portion 44b through the opening. Each scale 74 and each detecting head 76 are exposed from the outer surface of the outer ring portion 44b.

When the inner ring portion 44a is positioned at the original position while in a non-operation state of the actuator 50, an original point for measuring the amount of movement is read from a graduation 74a on the scale 74 by the detecting head 76. The detecting head 76 and the scale 74 form an optical encoder.

Further, the head holder 75 of the first embodiment is made of heat insulation material such as ceramics. Thus, heat of the detecting head 76, which is generated by the sensor 72 during measuring, is prevented from being transferred to the static lens 38b and the movable lens 38a through the head holder 75.

A flange portion 37a is formed in the intermediate portion of the barrel 37. A cylindrical jacket 79 (shown by broken lines) is placed on the flange portion 37a. The jacket 79 surrounds the barrel modules 42 positioned above the flange portion 37a. A hole 80 through which a cable 51a from the control device 51 passes is formed in the peripheral wall of the jacket 79. A sealing member 81 is attached to the insertion hole 80. Thus, the barrel 37 above the flange portion 37a has a double structure. When an inert gas is introduced inside the barrel 37 from the bottom end, the inside of the barrel 37 is filled with the inert gas. The inert gas is expelled through the cutaway portion 49, the slits 63 and the through holes 64. Expelling inert gas prevents impurities (light absorbing materials that absorb exposing light) generated by the displacement of the actuator 50, the guide mechanism 61 and the parallel link mechanism 66 from adhering to the optical lenses. Nitrogen gas and rare gases such as helium gas can be used as the inert gas.

The movable lens 38a is moved in the optical axial direction by the optical element holding device 43 as follows.

First, on of the actuators 50 is extended by a displacement amount dL while being pivoted about the rotating pivot mechanism 54 (shown in FIG. 11) by the application of voltage to the actuator 50. Then, the first link 62a of the elastic hinge link mechanism 62 is pivoted clockwise about the fulcrum P1. After that, the lower end connection point P3, which connects the second link 62b to the first link 62a, is displaced by the amount of displacement dx to the left and by the amount of displacement dy upward.

On the other hand, the connecting arm portion 59 is held by the guide mechanism 61 so that it may be moved only in the optical axial direction. Accordingly, the displacement of the connection point P3 moves the second link 62b upward and also moves the connecting arm portion 59 upward only by the amount of displacement dY. The actuator 50 lifts the connecting arm 59 via the guide mechanism 61 and the elastic hinge link mechanism 62.

The first link 62a and the second link 62b of the elastic hinge link mechanism 62 convert the displacement of the actuator 50 to the optical axial direction, amplify the displacement of the actuator 50 by two steps, and transfer the displacement to the connecting arm portion 59. As a result, a slight displacement of the actuator 50 moves the movable lens 38a in the optical axial direction in a relatively large distance.

If the actuator 50 is in a non-operating state and the first link 62a is positioned at the original position, the vertical (optical axial) distance between the fulcrum P1 and the connection point P2 is expressed by a, the vertical distance between the fulcrum P1 and the connection point P3 is expressed by b, and the horizontal (perpendicular to the optical axis) distance between the fulcrum P1 and the connection point P3 is expressed by c, the amounts of displacement dx and dy of the connection P3 are expressed by the following equations (1) and (2).

$$dx = (b/a) \times dL \quad (1)$$

$$dy = (c/a) \times dL \quad (2)$$

When the second link 62b is positioned at the original position, an angle formed by a straight line between the connection point P3 and the connection point P4, and the horizontal line is expressed by $\alpha$, and the amount of displacement dY of the connection point P4, that is the connecting arm portion 59, is expressed by the following equation (3).

$$dY = (1/\tan \alpha) \times dx + dy \quad (3)$$

From equations (1), (2) and (3), the amount of displacement dY of the connecting arm portion 59 is determined by the following equation (4).

$$dY = \{(1/\tan \alpha) \times (b/a) + (c/a)\} \times dL \quad (4)$$

In equation (4), the parameters a to c and $\alpha$ can be set comparatively freely. Thus, by optionally setting the parameters a to c and $\alpha$, the magnification ratio of the displacement amount dY to the displacement amount dL can be set to a desired value. Therefore, the degree of freedom in the design of the optical element holding device 43 and the barrel 37 provided with the optical element holding device 43 is improved.

The first embodiment of the invention has the following merits.

(A) The optical element holding device 43 includes the inner ring portion 44a, which engages with the peripheral edge of the movable lens 38a and holds the movable lens 38a, and the outer ring portion 44b, which moves the inner ring portion 44a in accordance with displacement of the actuator 50. The outer ring portion 44b is integrally connected to the inner ring portion 44a and is located outside the inner ring portion 44a. Further, the inner ring portion 44a and the outer ring portion 44b are moved relative to one another substantially along the optical axis of the movable lens 38a based on the displacement of the actuator 50.

Thus, the barrel modules 42 can be stacked in the optical axial direction of the movable lens 38a without the load of the stacked barrel modules 42 acting on the inner ring portion 44a. Accordingly, even one of the lenses 38 positioned in the vicinity of the intermediate portion of the barrel 37 is driven with high precision by the actuator 50 in the optical axial direction. Further, since the outer ring portion 44b is positioned while being further shifted in the radial direction than the inner ring portion 44a, the optical axial size of the barrel 37 is relatively short.

(B) The movable lens 38a, which is moved based on the displacement of the actuators 50, is held by the inner ring portion 44a. The static lens 38b, which is stationary, is held by the outer ring portion 44b. Further, the movable lens 38a is located so as to substantially overlap with the static lens 38b. Thus, it is not necessary to separately provide another barrel for holding the static lens 38b. Further, since the movable lens 38a and the static lens 38b are held so as to overlap with each other inside the barrel module 42, the barrel 37 is compact.

(C) The optical element holding device 43 includes the sensors 72 for measuring the amount of relative movement of the inner ring portion 44a with respect to the outer ring portion 44b. Accordingly, the amount of axial movement of the movable lens 38a can be correctly measured. Moreover, the detecting head 76 is mounted on the outer ring portion 44b through the head holder 75, which is made of a heat insulation material. Thus, the heat generated by the activated sensor 72 is prevented from being transferred to the lens 38. As a result, degradation of precision in the lens 38 is reduced.

(D) In the optical element holding device 43, the sensor 72 includes the non-contact encoder provided with the scale 74 and the detecting head 76. Thus, the amount of movement of the movable lens 38a based on the displacement of the actuator 50 can be measured with high precision while avoiding the influence of the drift.

(E) The scale 74 and the detecting head 76 are arranged so as to be exposed on the outer surface. As a result, it is easy to conduct maintenance such as replacement or adjustment of the scale 74 and the detecting head 76.

(F) The sensor 72 includes an original point detecting mechanism, which detects the original point for measuring the relative amount of movement of the inner ring portion 44a and the outer ring portion 44b. Therefore, the amount of movement of the movable lens 38a can be correctly measured by measuring the absolute position of the movable lens 38a based on the detected original point.

(G) Three actuators 50 are provided on the peripheral surface of each outer ring portion 44b at equal angle intervals. Thus, the three actuators 50 permit the movable lens 38a to tilt and be driven with high precision in the optical axial direction.

(H) Each sensor 72 is located at a median position between two adjacent actuators 50 on the peripheral surface of the outer ring portion 44b. Therefore, the three actuators 50 and the three sensors 72 are arranged in a compact manner in the outer ring portion 44b. Accordingly, the radial size of the barrel 37 is limited. Further, since the actuators 50 and the sensors 72 are alternately arranged in the circumferential direction of the outer ring portion 44b, their maintenance is relatively easy.

(I) The longitudinal axis of the actuators 50 are tangential to the outer ring portion 44b. Thus, the actuators 50 do not extend greatly from the outer periphery of the outer ring portion 44b. Further, since the actuators 50 with respect to the lateral direction are positioned in the optical axial direction of the movement lens 38a, the enlargement of the barrel module 42 in the optical axial direction is minimum. Therefore, a compact barrel 37 is provided.

(J) The first and second end portions of the actuator 50 are connected to the outer ring portion 44b through the rotating pivot mechanism 54. The rotating pivot mechanism 54 transfers the driving force of the actuator 50 without generating distortion and drives the movable lens 38a with high precision.

(K) Three cutaway portions 49 are formed in the wall of the outer ring portion 44b, and each actuator 50 is accommodated in one of the cutaway portions 49. Thus, since the actuators 50 do not extend outside of the outer ring portion 44b, the barrel 37 is compact. Further, since the cutaway portions 49 are opened at the peripheral surface of the outer ring portion 44b, the maintenance such as replacement and adjustment of the actuator 50 is relatively easy.

(L) Each actuator 50 includes a piezo-electric element. Thus, the movable lens 38a is driven by the actuator 50 with high precision, low heat generation, high stiffness and high cleanliness.

(M) The inner ring portion 44a is connected to the outer ring portion 44b and the actuator 50, through the displacement increasing mechanism 60, which amplifies the displacement of the actuator 50, and the guide mechanism 61, which guides the movement of the inner ring portion 44a in a predetermined direction. The displacement increasing mechanism 60 converts a small displacement of the actuator 50 to a large displacement and moves the inner ring portion 44a accordingly. Further, the guide mechanism 61 changes the movement of the inner ring portion 44a in a predetermined direction more accurately. Therefore, the movable lens 38a is driven with high precision.

(N) The displacement increasing mechanism 60 includes a conversion function, which converts the displacement direction of the actuator 50 to the movement direction of the movable lens 38a. Thus, even though the displacement direction of the actuator 50 is different from the movement direction of the movable lens 38a, the displacement increasing mechanism 60 increases the displacement of the actuator 50 and transfers the increased displacement with the displacement direction converted. Therefore, the construction of the optical element holding device is simplified.

(O) The displacement increasing mechanism 60 includes the elastic hinge mechanism 62, which has the slits 63 and the through holes 64. Thus, the displacement increasing mechanism 60 can be easily manufactured by a wire cutting process using a member integral with the inner ring portion 44a and the outer ring portion 44b. Therefore, the structure of the displacement increasing mechanism 60 is simple, and the number of parts of the optical element holding device 43 is reduced.

(P) The guide mechanism 61 includes the parallel link mechanism 66 having the slits 63 and through holes 64. The levers 66a and 66b of the parallel link mechanism 66 are arranged along a tangential line to the movable lens 38a. Thus, the guide mechanism 61 can be easily manufactured by a wire cutting process using a member integral with the inner ring portion 44a and the outer ring portion 44b. Therefore, the structure of the guide mechanism 61 is simple, and the number of parts of the optical element holding device 43 is reduced.

Further, the longitudinal directions of the levers 66a and 66b extend in the tangential direction to the movable lens 38a. Thus, even if pivoting of the levers 66a and 66b causes a slight cosine error, the cosine error does not cause a lateral shift in the radial direction of the movable lens 38a or deform the upper lens support 46 for the movable lens 38a. As a result, radial displacement of the movable lens 38a is reliably limited and the movable lens 38a is accurately moved in the optical axial direction.

Additionally, the guide mechanism 61 can be elastically deformed in a twist direction or in a compression direction in the elastic hinge portion 65. Thus, the guide mechanism 61 can also be moved by a necessary distance in the tilt direction while guiding the inner ring portion 44a in the optical axial direction with high precision by utilizing the elastic deformation.

(Q) The flat mounting surface 48 is formed on the upper end surface of the outer ring portion 44b and the lower end surface of the base ring 45. Thus, when the barrel modules 42 are stacked, the base ring 45 in the upper barrel modules 42 contacts the outer ring portion 44b in the lower barrel modules 42. The load of the barrel modules 42 acts on the mounting surface 48 (the outer ring portion 44b and the base ring 45) and does not act on the inner ring portion 44a. Therefore, the barrel modules 42 are stable when stacked in the optical axial direction.

(R) The guide mechanism 61 is arranged such that the position of the guide mechanism 61 substantially matches the optical pivotal position of the movable lens 38a, which is driven based on the displacement of the actuator 50. Thus, even when the movable lens 38a is tilted, the movable lens 38a can be accurately moved in the optical axial direction without radially displacing the movable lens 38a.

(S) The tension spring 69 causes the inner ring portion 44a to return to the boundary position within a movable range in the non-operating state of the actuator 50. Thus, the movable range of the inner ring portion 44a is set to the opposite sides of the neutral point in the non-operating state of the actuator 50. Therefore, the inner ring portion 44a can be moved in a relatively wide range, and the movement of the movable lens 38a can be easily adjusted.

(Second Embodiment)

Next, an optical element holding device 43 according to a second embodiment of the present invention will be explained based mainly on differences from the first embodiment mainly.

Figure 15:
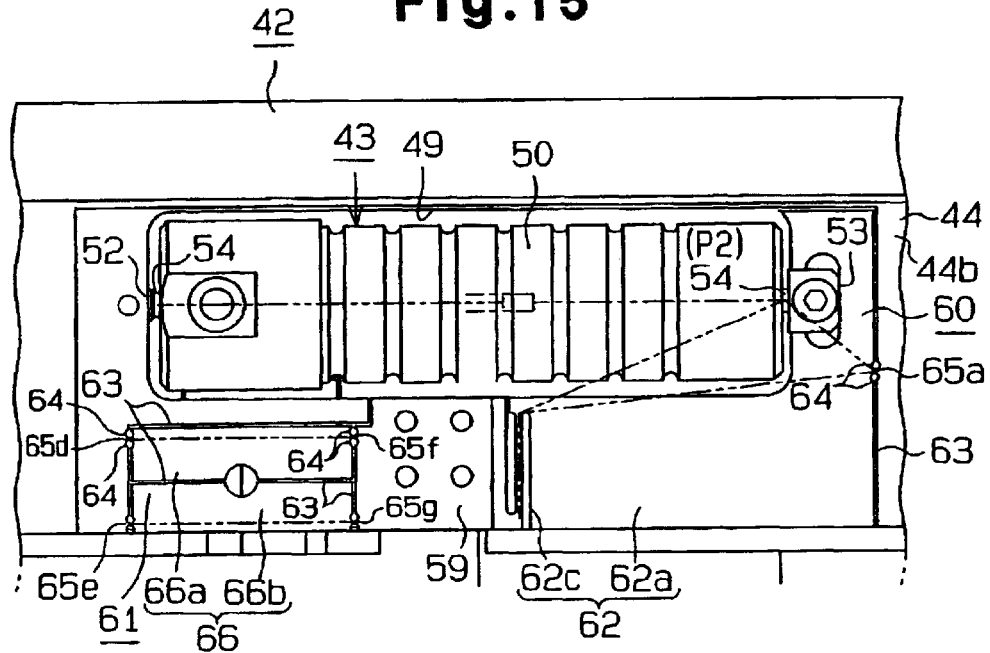
FIG. 15 is an enlarged side view of a barrel module of an exposure apparatus according to a second embodiment of the present invention.
Figure 16:
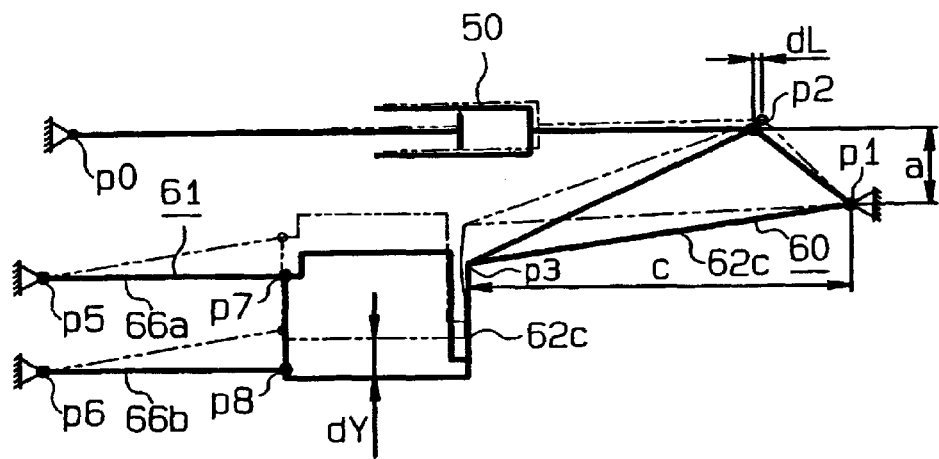
FIG. 16 is a schematic diagram of FIG. 15.

As shown in FIGS. 15 and 16, the displacement increasing mechanism 60 of an optical axial holding mechanism 43 includes an elastic hinge link mechanism 62 having a plurality of slits 63 and a plurality of through holes 64. The elastic hinge link mechanism 62 includes a first link 62a and an elastic piece 62c. The left end portion of the first link 62a is connected to the right edge of the connecting arm portion 59 through the elastic piece 62c.

For example, as shown in FIG. 16, when the actuator 50 is displaced by the amount of displacement dL with the application of voltage thereto, the first link 62a is pivoted clockwise about the fulcrum P1 and the connecting arm portion 59 is moved upward by the elastic piece 62c. Then, the connecting arm portion 59 is guided in the optical axial direction by the guide mechanism 61 (parallel link mechanism 66) and is moved upward by the displacement amount dY. At this time, the connection portion between the first link 62a and the elastic piece 62c is slightly displaced to the left side. However, the displacement to the left side is absorbed by the elastic deformation of the elastic piece 62c.

Therefore, slight displacement of the actuator 50 is converted to great displacement of the movable lens 38a with respect to the optical axial direction. In a state where the first link 62a is positioned at the original position, when a vertical direction distance between the fulcrum P1 and the connection point P2 is defined as a and a horizontal direction distance between the fulcrum point P1 and the connection point P3 is defined as c, the amount of displacement dY of the connecting arm portion 59 is expressed by equation (5).

$$dY=(c/a) \times dL \qquad (5)$$

In equation (5) by setting the respective parameters a and c appropriately, the movable lens 38a can be moved by an optional magnification ratio. According to the second embodiment, substantially the same effects as those of the first embodiment can be obtained.

(Third Embodiment)

Next, an optical element holding device 43 according to a third embodiment of the present invention will be explained based mainly on differences from the first embodiment.

Figure 17:
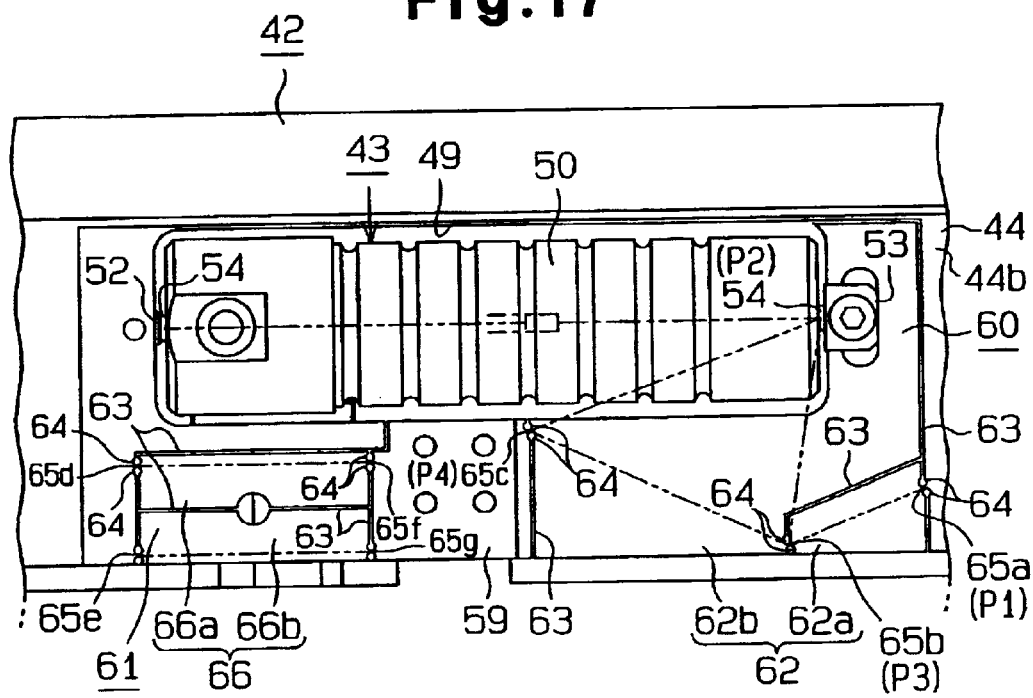
FIG. 17 is an enlarged side view of a barrel module of an exposure apparatus according to a third embodiment of the present invention.
Figure 18:
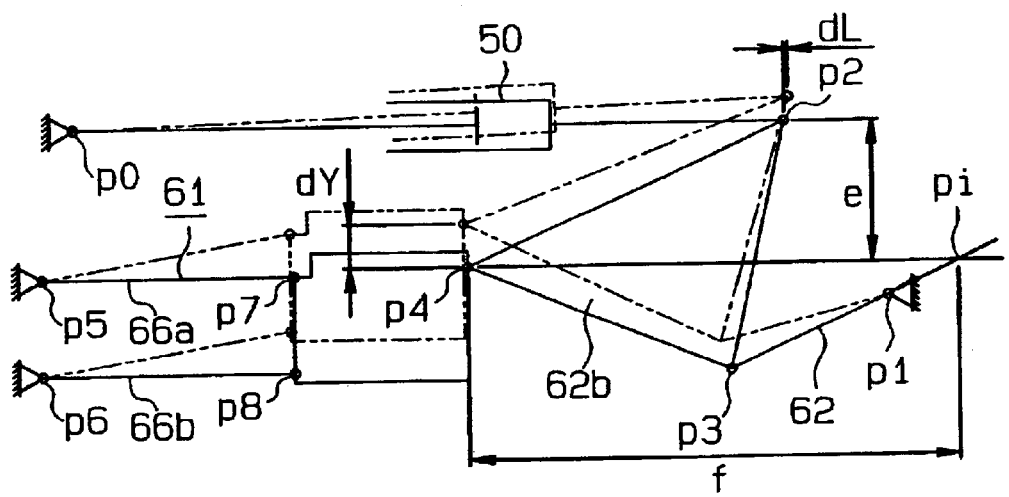
FIG. 18 is a schematic diagram of FIG. 17.

As shown in FIGS. 17 and 18, the optical element holding device 43 of the third embodiment includes a displacement increasing mechanism 60 including an elastic hinge mechanism 62 having a plurality of slits 63 and a plurality of through holes 64. The elastic hinge link mechanism 62 includes a first link 62a and a second link 62b. The first link 62a is connected to the periphery wall of the outer ring portion 44b at the elastic hinge portion 65a (the fulcrum P1) and is connected to the second link 62b at the connection point P3 positioned at the lower end of the second link 62b. Further, the second link 62b is connected to the actuator 50 at the upper connection point P2 positioned at the second end portion of the actuator 50 and is connected to the connecting arm portion 59 at the connection point P4 positioned at the left end of the second link 62b.

For example, as shown in FIG. 18, when the actuator 50 is displaced by the displacement amount dL with the application of voltage, a force that pulls the upper connection point P2 upward acts on the second link 62b. Further, the lower connection point P3 is guided only in the vertical direction (optical axial direction) by the first link 62a. Further, the left connection point P4 is guided in the vertical direction by the guide mechanism 61, which includes the connecting arm portion 59 and the parallel link mechanism 66. Thus, the second link 62b is pivoted clockwise about an instant point of intersection P1 formed by a substantial extension of a line from the fulcrum P1 to the connection point P3 and an extension extended in a horizontal direction from the connection point P4. Therefore, the connecting arm portion 59 is moved upward by the displacement amount dY.

As a result, small displacement of the actuator 50 is converted to great displacement of the movable lens 38a with respect to the optical axial direction. When the second link 62b is positioned at the original position, when a vertical distance between the instant pivotal center P1 and the connection point P2 is defined as e and a horizontal direction distance between the instant pivotal center P1 and the connection point P4 is defined as f, the amount of displacement dY of the connecting arm portion 59 is expressed by equation (6).

$$dY=(f/e) \times dL \qquad (6)$$

In equation (6), by setting the respective parameters e and f appropriately, the movable lens 38a can be moved at an optional magnification ratio.

Thus, according to the third embodiment of the present invention, the following additional merits can be obtained.

The displacement increasing mechanism 60 includes the elastic hinge mechanism 62 including the first link 62a and the second link 62b. The second link 62b sets a hypothetical instant pivotal center P1 further away from the actual fulcrum P1. As the actuator 50 is displaced, the second link 62b is pivoted about the instant pivotal center P1. Thus, the magnification ratio of the movement of the movable lens 38a to the displacement amount of the actuator 50 can be varied greatly.

(Fourth Embodiment)

Next, an optical element holding device 43 according to a fourth embodiment of the present invention will be explained based mainly on differences from the first embodiment.

Figure 19:
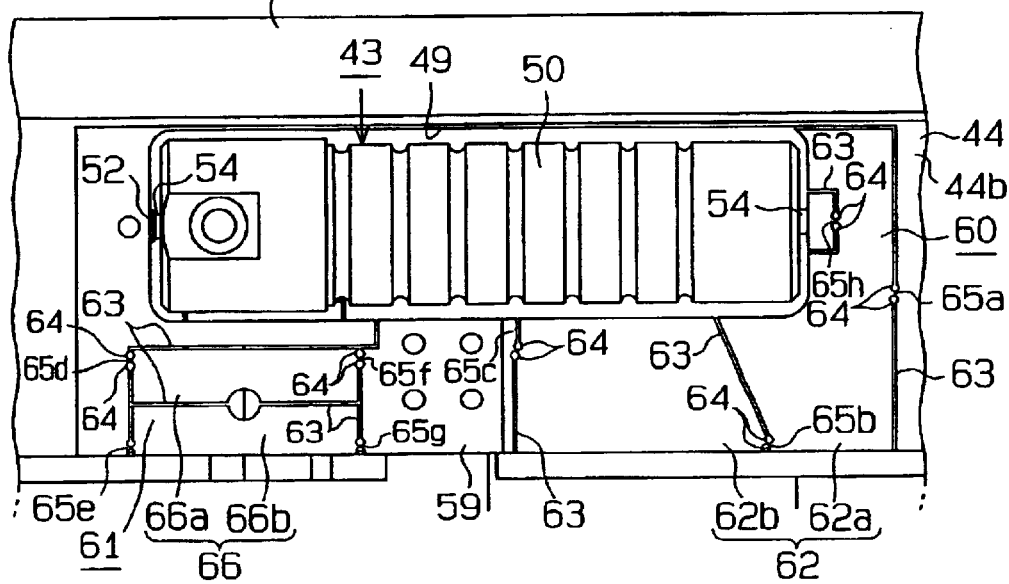
FIG. 19 is an enlarged side view of a barrel module of an exposure apparatus according to a fourth embodiment of the present invention.

As shown in FIG. 19, a rotating pivot mechanism 54 positioned at the second end portion of the actuator 50 is different from that of the first embodiment. The rotating pivot mechanism 54 includes a plurality of slits 63 (two in the fourth embodiment) manufactured by a wire cutting process such that they are substantially continued to the outer ring portion 44b, and through holes 64 formed on the respective one ends of the slits 63. An elastic hinge portion 65 is formed between two through holes 64.

Thus, according to the fourth embodiment the following merits can be obtained in addition to the merits of the first embodiment.

The rotating pivot mechanism 54 arranged at the second end portion of the actuator 50 includes the slits 63 and the through holes 64 formed with a predetermined space at its opposite end. Thus, when the actuator 50 is operated, the frictional resistance of the rotating pivot mechanism 54 is reduced. As a result, the driving force of the actuator can be transferred without generating distortion.

(Fifth Embodiment)

Next, an optical element holding device 43 according to a fifth embodiment of the present invention will be explained based mainly on differences from the first embodiment.

Figure 20:
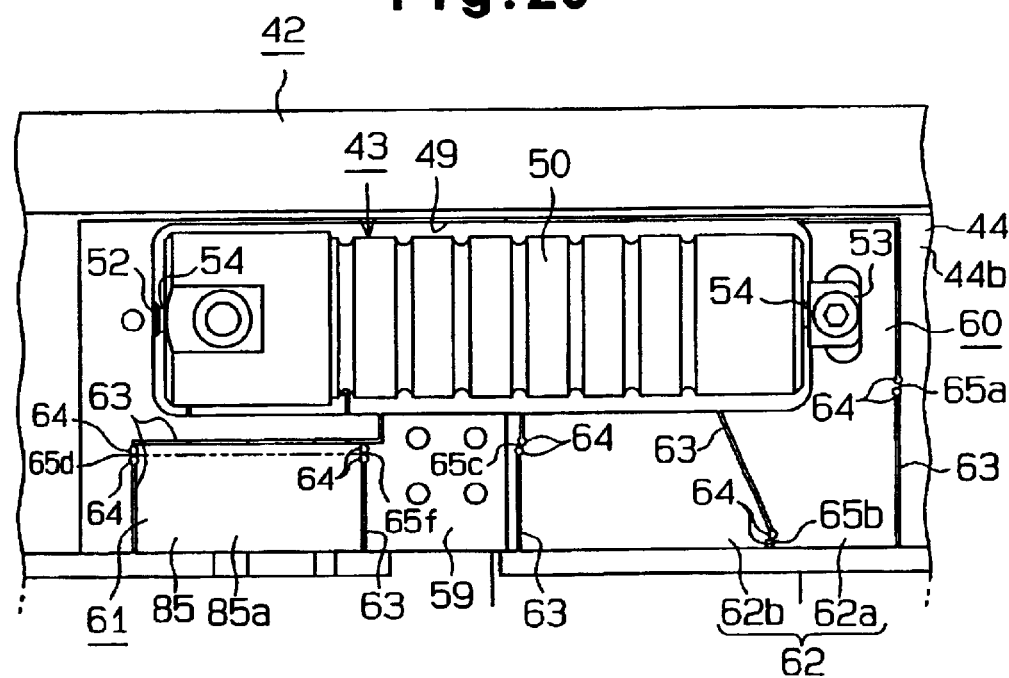
FIG. 20 is an enlarged side view of a barrel module of an exposure apparatus according to a fifth embodiment of the present invention.

As shown in FIG. 20, a guide mechanism 61 of the fifth embodiment is different from that of the first embodiment. The guide mechanism 61 includes a one link mechanism 85 formed between a plurality of slits 63 and a plurality of through holes 64. A lever 85a of the link mechanism 85 is positioned along a tangential line to the movable lens 38a.

As the actuator 50 is displaced, the connecting arm portion 59 is moved through the displacement increasing mechanism 60, and the lever 85a of the link mechanism 85 is pivoted along the outer surface of the lever 85a. As a result, the connecting arm portion 59 is moved in the optical axial direction.

Therefore, according to the fifth embodiment, the following further merits can be obtained.

The guide mechanism 61 includes a link mechanism 85, which includes the lever 85a positioned along a tangent line to the movable lens 38a. Thus, the structure of the guide mechanism 61 is simple and the number of parts of the optical element holding device 43 is reduced. Since the link mechanism 85 has relatively high twist flexibility, the movable range of the tilt operation of the movable lens 38a is increased.

It should be apparent to those skilled in the art that the present invention may be embodied in many other specific forms without departing from the spirit or scope of the invention. For example, the first to fifth embodiments of the present invention may be modified as follows.

In place of the displacement increasing mechanism 60 which changes the displacement direction or magnitude of the actuator 50, a conversion mechanism, which converts the displacement direction of the actuator 50, and a displacement increasing mechanism, which changes the displacement magnitude of the actuator 50, may be separately provided. The second link mechanism may be omitted when the first link mechanism has the function of the second link mechanism. The first link mechanism may be omitted when the second link mechanism has the function of the first link mechanism.

In place of the actuator 50, or the piezo-electric element, a magnetostrictive actuator or a fluid pressure actuator can be used. The displacement increasing mechanism 60 may be omitted if the moving range of the inner ring portion 44a is relatively small.

The tension spring 69 placed between the inner ring portion 44a and the outer ring portion 44b may be omitted. In this case, a return spring-contained piezo-electric element (actuator 50) may be used. At the time of non-operation of the actuator 50, the inner ring portion 44a is returned to one end within the movable range by the return spring.

As the optical element, another optical element such as a parallel plate, a phase difference plate other than the lens 38a can be used. A polarizing element, which polarizes the exposure light beam EL, and a reflecting optical element, which reflects the exposure light beam EL, can be used.

The gap adjusting member, which is located between the adjacent mounting surfaces 48, can be omitted. In this case, the mounting surface 48 directly contacts the adjacent mounting surface 48.

The optical element holding device 43 may be embodied as a holding device for various optical elements or a holding device for a vertical optical element in the illuminating optical system 33 of the exposure apparatus 31 without being limited to the holding construction of a lateral type lens 38 in the projection optical system 35 of the exposure apparatus 31. Further, the optical element holding device 43 may be embodied as a holding device for an optical element of another optical machine such as a microscope or an interferometer in an optical system.

The exposure apparatus of the present invention is not limited to the exposure apparatus 31 for manufacturing the semiconductor devices or limited to the reduction exposure type exposure apparatus. That is, this invention includes a liquid crystal display device, an image pickup device, and a thin film magnetic head. Further, this invention includes a non-magnification exposure type exposure apparatus, a step-and-repeat system one-shot exposure type exposure apparatus, and a step-and-scan system scanning exposure type exposure apparatus.

As the exposure apparatus, a proximity exposure apparatus that exposes a mask pattern while keeping the mask and the substrate in close contact with each other may be used without the use of the projection optical system. Further, as the projection optical system, a refraction system or a catadioptric system may be used.

At least some of lenses or reflective optical elements that form the illumination optical system and the projection optical system are held by the optical member holding device according to the present invention. The illumination optical system and the projection optical system are incorporated in the exposure apparatus body. A wafer stage (which includes a reticle stage in the case of scanning type exposure apparatus) including a number of machine parts is mounted on the exposure apparatus body, the exposure apparatus is connected to the optical member holding device. A gas supply pipe for supplying gas into a light path for an exposure light beam is connected to the optical member holding device. After that, a total adjustment (electric adjustment, operation confirmation) is carried out so that the exposure apparatus of this embodiment is adjusted. Moreover, the individual parts of the optical member holding device are incorporated after cleaning impurities such as treated oil, a metallic material. It is preferred that the manufacturing of the exposure apparatus be carried out in a clean room where the temperature, humidity and pressure are controlled and the cleanliness is adjusted.

Glass materials in each embodiment such as fluorite, quartz were explained above. However, the optical member holding device of each embodiment can be applied to an apparatus where a crystal such as lithium fluoride, magnesium fluoride, strontium fluoride, lithium-calcium-aluminum-fluoride, lithium-strontium-aluminum-fluoride, or glass fluoride composed of zirconium-barium-lanthanum-aluminum, or improved quartz such as fluorine doped quartz glass, fluorine and hydrogen doped quartz, OH (hydroxyl) group-containing quartz glass, or fluorine and OH group-containing quartz glass is used.

Next, a manufacturing method using the above-mentioned exposure apparatus will be explained. Specifically, the exposure apparatus is used in a lithography process.

Figure 21:
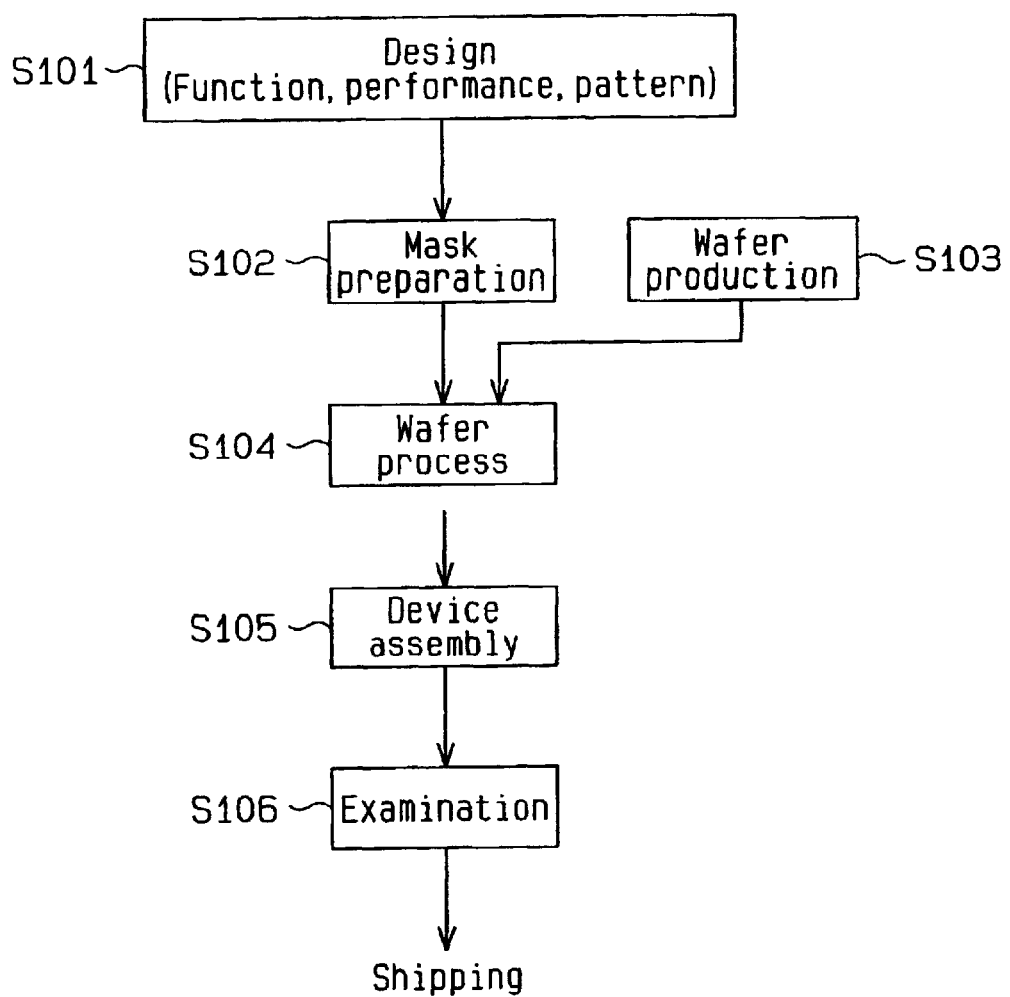
FIG. 21 is a flowchart of a manufacturing process of a device.

FIG. 21 is a flowchart of a manufacturing process of various devices such as semiconductor chips, liquid crystal panels, CCDs, thin film magnetic heads, and micromachines. In step S101, a circuit pattern for a device (microdevice) is designed depending on the functions and performances of the device. For example, a circuit of a semiconductor device is designed. In step S102, a mask (reticle) having the designed circuit pattern is manufactured. In step S103, a wafer is manufactured by use of a device material such as silicon.

Next, in step S104, the mask and the wafer prepared in steps S101 to S103 are used, and the wafer is treated in accordance with for example a lithography technique (which will be described later). Thus, the designed circuit is formed on the wafer. Then, in step S105, a device is assembled by the use of the wafer. Step S105 includes a dicing process, a bonding process, a packaging process (chip encapsulation) as desired.

Then, in step S106, the device manufactured in step S105 is examined. The examination includes an operation confirmation test and a durability test of the device. Then, examination-passed devices are shipped.

Figure 22:
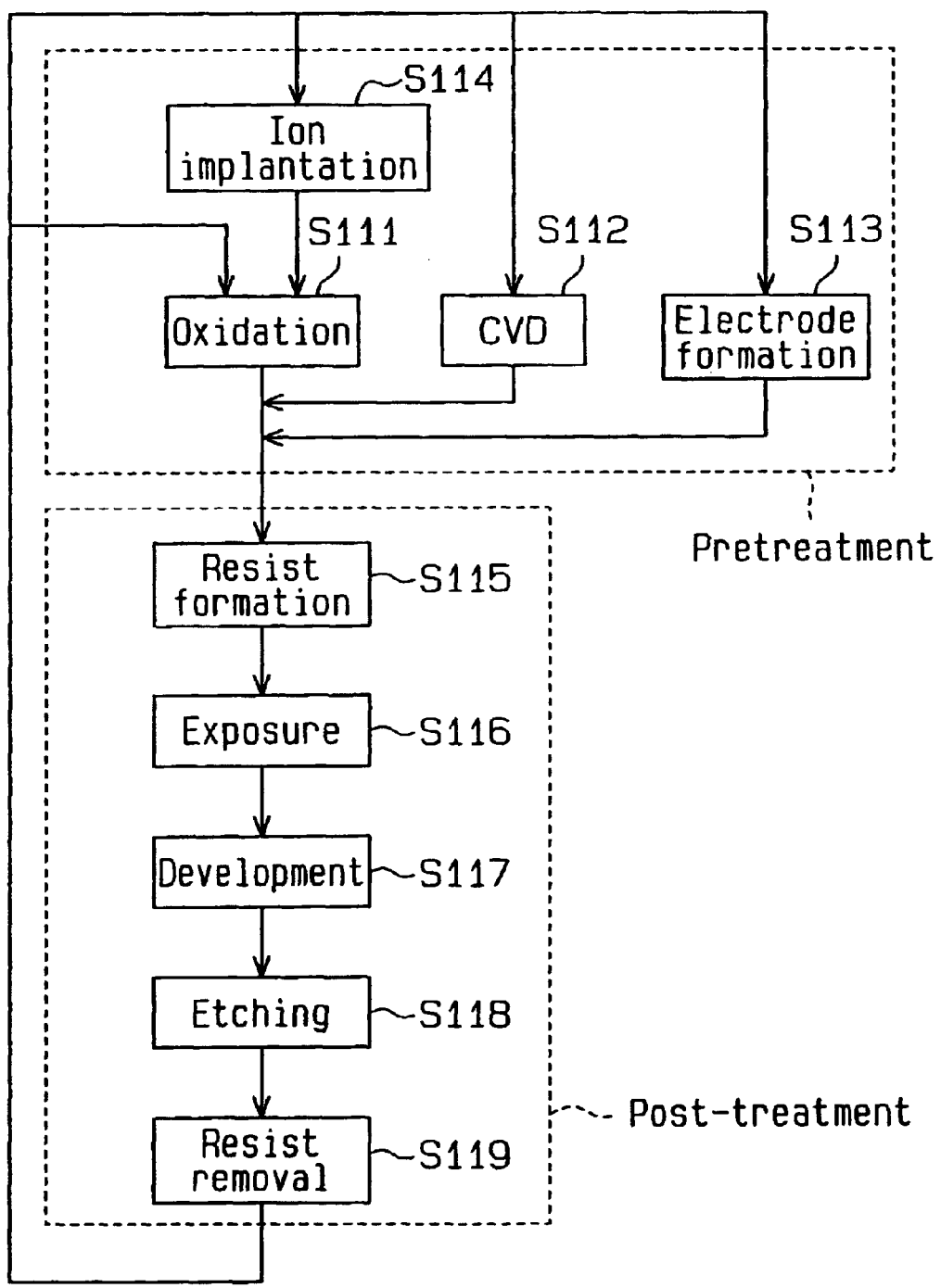
FIG. 22 is a detailed flowchart relating to the wafer process in FIG. 21 in the case of a semiconductor device.
Figure 23:
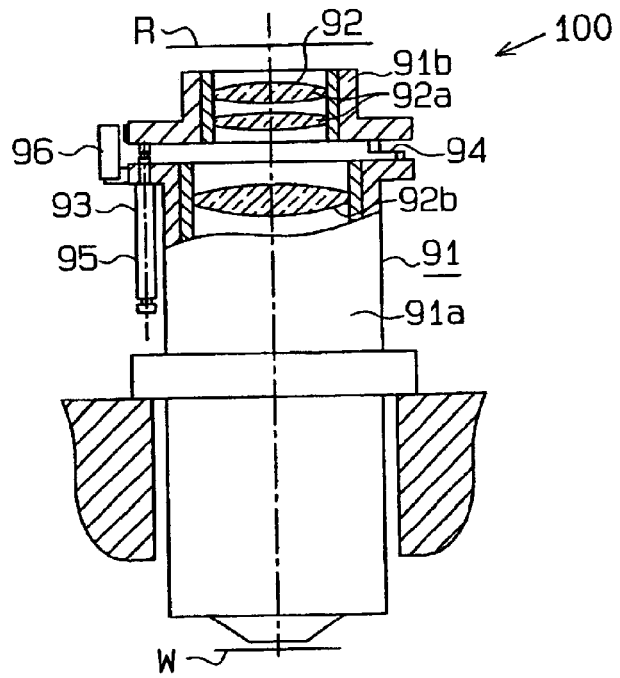
FIG. 23 is a schematic cross-sectional view of a prior art exposure apparatus.
Figure 24:
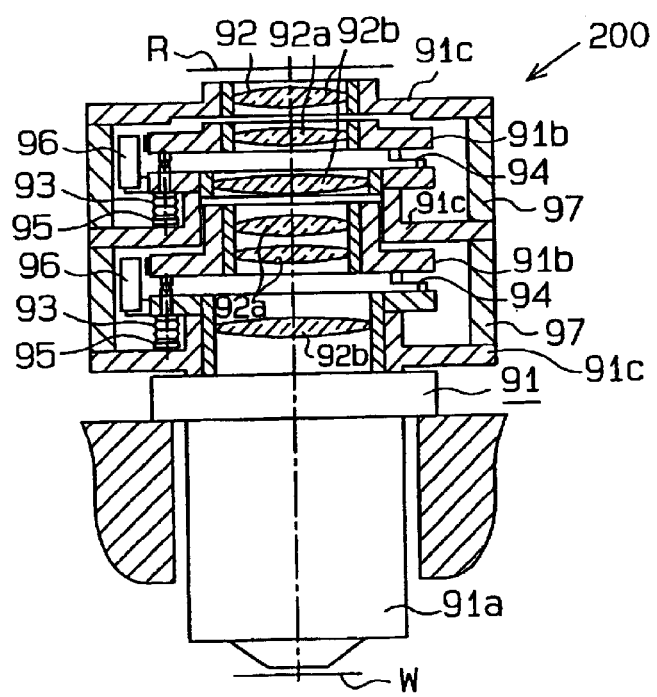
FIG. 24 is a schematic cross-sectional view of a proposed exposure apparatus.
Figure 25:
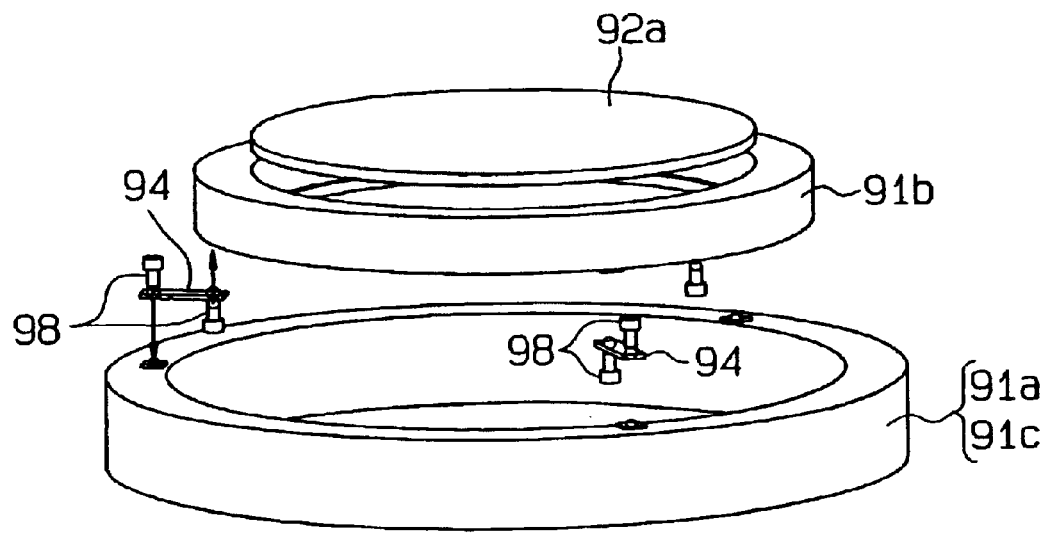
FIG. 25 is a partial exploded view of the barrel of the exposure apparatus in FIGS. 23 and 24.
Figure 26:
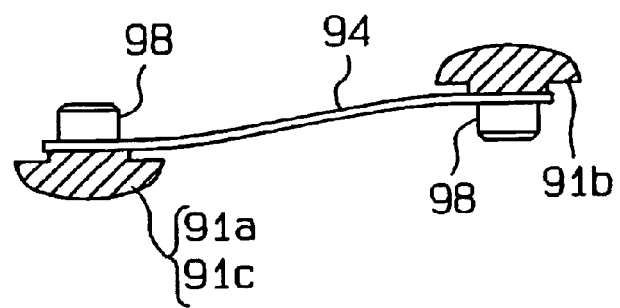
FIG. 26 is an enlarged cross-sectional view of a plate spring in FIG. 25.
Figure 27:
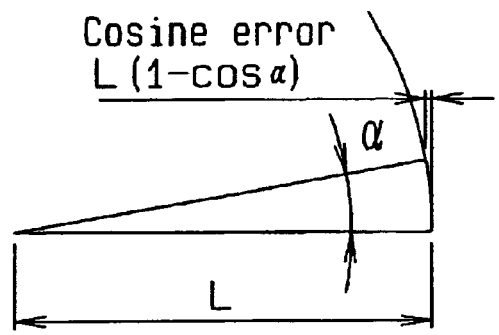
FIG. 27 is a schematic diagram of a deformed plate spring in FIG. 26.
Figure 28:
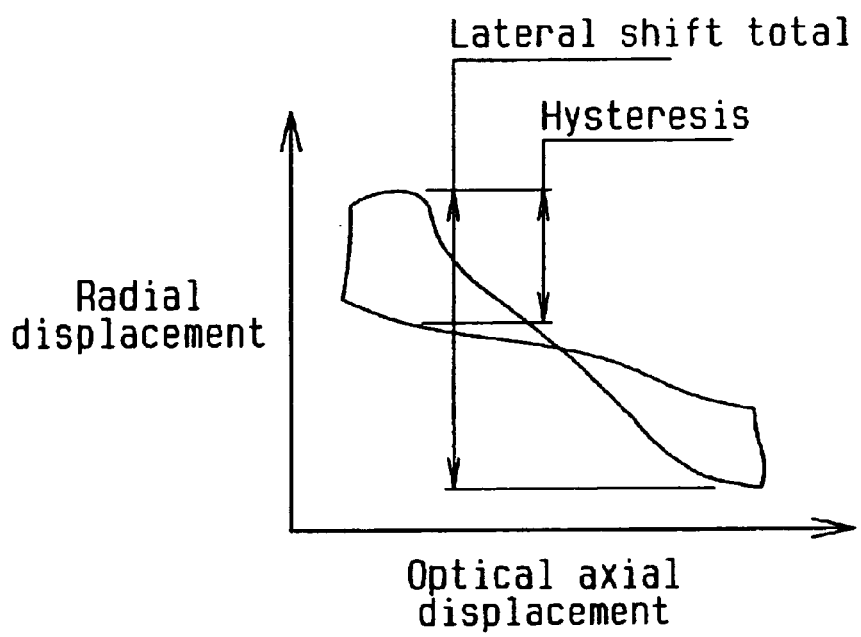
FIG. 28 is a graph showing the longitudinal displacement and the lateral displacement of a lens when the barrel in FIG. 25 is driven.

FIG. 22 is a detailed flowchart of step S104 in FIG. 21.

Each of steps S111 to S114 is a pretreatment step in the wafer process (step S104), where a suitable step is selectively executed.

In step S111, a surface of the wafer is oxidized. In step S112, an insulating film is formed on the wafer surface. The insulating film is preferably formed in accordance with a CVD method. In step S113, an electrode is formed on the wafer by vapor deposition. In step S114, ions are implanted into the wafer.

Subsequently to the pretreatment steps, the following post-treatment steps are executed.

In step S115, a photosensitive agent for forming a resist is applied onto the wafer. In step S116, a mask circuit pattern is then exposed and transferred onto the wafer by the use of the above-described exposure apparatus (lithography system). During the transferring, the optical element holding device 43 corrects distortion and aberration, which are caused by atmospheric pressure changes and illumination heat. In step S117, the correctly transferred wafer is then developed. After that, in step S118, exposed members in portions other than the portions where the resist is remaining are removed by etching. Then, in step S119, the used resist is removed.

The pretreatment and the post-treatment are repeatedly carried out so that multiple circuit patterns are formed on the wafer.

In step S116 (exposure step) of the present device manufacturing method, the exposure apparatus of the present invention is used. In the exposure apparatus of the present invention, the resolution of exposure is enhanced and the amount of exposure is controlled with high precision by the use of exposure light beam in the vacuum ultraviolet range. Thus, according to the present device manufacturing method, a device with high density of the minimum line width of about 0.1 $\mu$m can be produced in a high yield.

The present examples and embodiments are to be considered as illustrative and not restrictive and the invention is not to be limited to the details given herein, but may be modified within the scope and equivalence of the appended claims.

What is claimed is:

1. An optical element holding device for a first optical element, comprising:
   an outer member;
   an inner member monolithically formed with the outer member and holding the first optical element;
   a drive element provided with the outer member;
   a drive mechanism which is connected to the outer member and the inner member and changes at least one of an amount of displacement of the drive element and a displacement direction of the drive element; and
   a measuring device arranged to measure the movement of the first optical element.

2. The optical element holding device according to claim 1, wherein the outer member holds a second optical element.

3. The optical element holding device according to claim 1, further comprising:
   a second holding member provided in the outer member to hold a second optical element; and
   a heat insulation element located between the measuring device and at least one of the first and the second optical elements.

4. The optical element holding device according to claim 1, wherein the measuring device measures an amount of displacement of the inner member with respect to the outer member, and wherein the movement of the first optical element is determined based on the measured displacement.

5. The optical element holding device according to claim 4, wherein the measuring device includes an optical encoder having a measurement portion fixed to the inner member and a measuring head fixed to the outer member.

6. The optical element holding device according to claim 1, wherein the outer member is annular having an upper portion, a lower portion and a side portion, and wherein the drive mechanism, is one of at least three equally spaced drive mechanisms formed in the side portion of the outer member.

7. The optical element holding device according to claim 6, wherein the measuring device is one of at least three equally spaced measuring devices arranged along the side portion of the outer member, and each of the measuring devices is located midway between two of the drive mechanisms that are adjacent.

8. The optical element holding device according to claim 1, wherein the outer member is annular having an upper portion, a lower portion and a side portion, wherein the drive element is an actuator that displaces in a predetermined direction, wherein the actuator is arranged in the connecting member such that the displacement of the actuator is tangential to the connection member.

9. The optical element holding device according to claim 8, further comprising a rotating pivot mechanism connected to the actuator and the outer member.

10. The optical element holding device according to claim 9, wherein the rotating pivot mechanism includes a cutaway spring formed in the outer member and defined by cuttings intersect the optical axis of the first optical element.

11. The optical element holding device according to claim 8, wherein the outer member includes a cutaway portion having an opening in which the actuator is accommodated.

12. The optical element holding device according to claim 11, wherein the actuator includes a piezo-electric element.

13. The optical element holding device according to claim 1, wherein the drive element is an actuator that displaces in a predetermined direction; wherein the drive mechanism comprises:
   a first link mechanism connected to the actuator, the outer member and the inner member, to transfer the displacement of the actuator to the inner member; and
   a second link mechanism, connected to the outer member and the inner member, to guide relative movement of the inner member with respect to the outer member in a predetermined direction.

14. The optical element holding device according to claim 13, wherein the displacement direction of the actuator differs from the movement direction of the first optical element, and the first link mechanism converts the displacement direction of the actuator to the movement direction of the first optical element.

15. The optical element holding device according to claim 13, wherein the first link mechanism includes a displacement increasing mechanism connected to the actuator to amplify the displacement of the actuator.

16. The optical element holding device according to claim 15, wherein the displacement increasing mechanism includes a cutaway spring formed in the outer member and defined by cuttings intersect the optical axis of the first optical element.

17. The optical element holding device according to claim 15, wherein the cutaway spring includes an elastic hinge link mechanism defined by a plurality of through holes extending to cross the optical axis of the first optical element, and a plurality of slits formed to be continued to the through holes.

18. The optical element holding device according to claim 13, wherein when the displacement of the actuator is transferred to the inner member by the first link mechanism, the second link mechanism guides the inner member in a predetermined direction in cooperation with the first link mechanism.

19. The optical element holding device according to claim 18, wherein the second link mechanism includes a parallel link mechanism defined by a plurality of through holes extending to cross the optical axis of the first optical element and a plurality of slits formed to be continued to the through holes, and wherein the parallel link mechanism is located along the tangential line of the first optical element.

20. The optical element holding device according to claim 18, wherein the outer member has at least one of the upper end mounting surface and the lower end mounting surface, the at least one of the mounting surface extends to cross the optical axis, and wherein when a plurality of optical element holding devices are stacked along the optical axis, the mounting surface is opposed to an mounting surface of the adjacent optical element holding device.

21. The optical element holding device according to claim 18, wherein the second link mechanism guides the inner member such that the position of the optical element matches an optical pivotal position of the optical element.

22. The optical element holding device according to claim 1, further comprising a return mechanism connected to the inner member to return the inner member to its original position.

23. The optical element holding device according to claim 1, wherein the inner member has an inner ring to which the outer edge portion of the first optical element is fixed, and the outer member has an outer ring having a mounting portion to which an outer ring of another optical element holding device is mounted, wherein the drive element is an actuator provided on the outer ring to connect the inner ring and the outer ring.

24. The optical element holding device according to claim 23, wherein the outer ring has a cylindrical wall having an opening, wherein the actuator is located in the opening.

25. The optical element holding device according to claim 23, wherein the drive mechanism includes a first link mechanism and a second link mechanism, and wherein the first link mechanism and the second link mechanism are formed in the cylindrical wall of the outer ring, and wherein the first link mechanism is connected to the inner ring and transfers displacement of the actuator to the inner ring, and the second link mechanism is connected to the inner ring and guides the inner ring to a predetermined direction in cooperation with the first link mechanism when displacement of the actuator is transferred to the inner ring.

26. The optical element holding device according to claim 23, wherein the outer ring has two ends, and wherein the mounting portion is provided in at least one of the ends of the outer ring.

27. The optical element holding device according to claim 23, wherein the outer ring has a peripheral wall having an opening, wherein the measuring device includes a measurement portion provided on the inner ring and a measuring head located in the opening to measure a displacement of the measurement portion, wherein a measured displacement of the measurement portion is readable by the measuring head through the opening.

28. A barrel structure accommodating a plurality of optical elements, comprising:
an optical element holding device which holds at least one of the optical elements, wherein the optical element holding device includes:
an outer member;
an inner member monolithically formed with the outer member and holding the optical element;
a drive element provided with the outer member;
a drive mechanism which is connected to the outer member and the inner member and changes at least one of an amount of displacement of the drive element and a displacement direction of the drive element; and
a measuring device arranged to measure the movement of said at least one of the optical elements.

29. An exposure apparatus for transferring a pattern image formed on a mask onto a substrate using exposure light beam, comprising:
a projecting optical system having at least one barrel module, wherein the barrel module includes:
an optical element;
an outer member;
an inner member communicated with an outer edge portion of the optical element to hold the optical element;
a drive element provided with the outer member; and
a drive mechanism which is connected to the outer member and the inner member and changes at least one of an amount of displacement of the drive element and a displacement direction of the drive element.

30. A method for making a semiconductor device using an exposure apparatus that transfers a circuit pattern image formed on a mask through a projection optical system onto a substrate using exposure light beam, the method comprising:
applying a photo sensitive agent on a workpiece;
exposing the circuit pattern image to the workpiece using the exposure apparatus, wherein the exposure apparatus includes at least one barrel modules, wherein each of the barrel modules includes:
an optical element;
an outer member;
an inner member communicated with an outer edge portion of the optical element to hold the optical element;
a drive element provided with the outer member; and
a drive mechanism which is connected to the outer member and the inner member and changes at least one of an amount of displacement of the drive element and a displacement direction of the drive element;
wherein the exposing step includes adjusting an image formation property of the projection optical system by moving the optical element;
developing the exposed workpiece, wherein the photo sensitive agent forms a resist corresponding to the circuit pattern on the workpiece by the developing;
etching an exposed region except for the resist; and
removing the resist from the workpiece.

31. The method according to claim 30, wherein a vacuum ultra violet exposing light beam is used in the exposing step.

32. An optical element holding device comprising:
a ring body accommodating an optical element, wherein the ring body includes:
an inner ring communicated with a peripheral edge portion of the optical element to hold the optical element; and
an outer ring monolithically formed with the inner ring;
an actuator provided with the ring body, wherein the actuator displaces
in a predetermined direction; and
a drive mechanism provided in the ring body to move the inner ring,
wherein the drive mechanism includes:
a displacement increasing mechanism formed in the outer ring; and a guide mechanism formed in the outer ring and connected to the inner ring, wherein the guide mechanism transfers displacement of the actuator to the inner ring and converts the displacement of the actuator in a direction substantially along the optical axis of the optical element.

33. The optical element holding device according to claim 32, wherein the outer ring has an outer wall and an inner wall, wherein the displacement increasing mechanism includes a plurality of slits and a plurality of through holes, wherein each of the slits and the through holes extends between the outer wall and the inner wall in an imaginary plane including the optical axis.

34. The optical element holding device according to claim 32, wherein the outer ring has an outer wall and an inside wall, and the guide mechanism includes a parallel link mechanism defined by a plurality of slits and a plurality of through holes, each of the slits and the through holes extending between the outer wall and the inside wall in an imaginary plane including the optical axis.

35. The barrel structure according to claim 28, wherein the measuring device measures an amount of displacement of the inner member with respect to the outer member, and wherein the movement of the first optical element is determined based on the measured displacement.

36. The barrel structure according to claim 28, wherein the drive element is an actuator that displaces in a predetermined direction; wherein the drive mechanism comprises:
   a first link mechanism connected to the actuator, the outer member and the inner member, to transfer the displacement of the actuator to the inner member; and
   a second link mechanism, connected to the outer member and the inner member, to guide relative movement of the inner member with respect to the outer member in a predetermined direction.

37. The exposure apparatus according to claim 29, further comprising a measuring device arranged to measure the movement of the optical element.

38. The exposure apparatus according to claim 37, further comprising:
   a second holding member provided in the outer member to hold a second optical element; and
   a heat insulation element located between the measuring device and at least one of the first and the second optical elements.

39. The exposure apparatus according to claim 37, wherein the measuring device measures an amount of displacement of the inner member with respect to the outer member, and wherein the movement of the first optical element is determined based on the measured displacement.

40. The exposure apparatus according to claim 29, wherein the inner member is monolithically formed with the outer member.

41. The optical element holding device according to claim 32, further comprising a measuring device disposed between the inner ring and the outer ring to measure the movement of the optical element.

42. The optical element holding device according to claim 41, wherein the measuring device measures an amount of displacement of the inner ring with respect to the outer ring, and wherein the movement of the optical element is determined based on the measured displacement.

* * * * *